(12) United States Patent
Yoshino

(10) Patent No.: US 6,828,619 B2
(45) Date of Patent: Dec. 7, 2004

(54) NONVOLATILE SEMICONDUCTOR STORAGE DEVICE

(75) Inventor: Akira Yoshino, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/445,827

(22) Filed: May 28, 2003

(65) Prior Publication Data

US 2003/0222294 A1 Dec. 4, 2003

(30) Foreign Application Priority Data

May 29, 2002 (JP) ........................................ 2002-155716

(51) Int. Cl.⁷ .............................................. H01L 29/76
(52) U.S. Cl. ...................... 257/314; 257/324; 257/325; 257/410; 257/411
(58) Field of Search ................................ 257/325, 314, 257/324, 410, 411

(56) References Cited

U.S. PATENT DOCUMENTS

| | | | | |
|---|---|---|---|---|
| 5,319,230 A | * | 6/1994 | Nakao | 257/325 |
| 5,589,700 A | * | 12/1996 | Nakao | 257/325 |
| 5,966,603 A | | 10/1999 | Eitan | |
| 6,310,376 B1 | * | 10/2001 | Ueda et al. | 257/315 |
| 6,580,124 B1 | * | 6/2003 | Cleeves et al. | 257/331 |
| 6,593,624 B2 | * | 7/2003 | Walker | 257/344 |

OTHER PUBLICATIONS

Y. Hayashi et al., "Twin MONOS Cell with Dual Control Gates", 2000 Symposium on VLSI Technology Digest of Technical Papers, p. 122–123, Dec. 2000.

* cited by examiner

*Primary Examiner*—Mark V. Prenty
(74) *Attorney, Agent, or Firm*—Young & Thompson

(57) ABSTRACT

A nonvolatile semiconductor storage device has a semiconductor substrate, a gate electrode formed on a surface of the semiconductor substrate, and a first diffusion layer and a second diffusion layer formed in the surface of the semiconductor substrate on opposite sides of the gate electrode, a channel region being formed between the first and second diffusion layers. A first insulating layer, isolated pieces of material and a second insulating layer are formed in order in a multilayer structure on the surface of the semiconductor substrate on the channel region.

14 Claims, 24 Drawing Sheets

NONVOLATILE SEMICONDUCTOR STORAGE DEVICE

BACKGROUND OF THE INVENTION

1. Field of the Invention

The present invention relates to a nonvolatile semiconductor storage device and, more particularly, to a metal oxide nitride oxide semiconductor (MONOS) type of nonvolatile semiconductor storage device.

2. Description of the Prior Art

There are two major types of nonvolatile storage elements formed as MIS transistors: those using the metal nitride oxide semiconductor (MNOS) type transistor, and those using the floating gate (FG) type transistor.

In the MNOS type element, information charge is accumulated in an interfacial region or the like formed in a boundary region in a two-layer insulating film. Elements of this type include those called MONOS having a silicon oxide film on a silicon nitride film, and also include those having various combinations of insulating films other than this combination of silicon oxide film and silicon nitride film.

The FG type element has a two-layer gate electrode structure in which information charge is accumulated on a floating gate electrode, which is a first gate electrode. In this structure, the first gate electrode is formed in a floating state on a silicon oxide film on a major surface of a semiconductor substrate, an interlayer insulating film in which a silicon oxide film and a silicon nitride film are combined is provided on the first gate electrode, and a second gate electrode, which is a control gate electrode, is formed on the interlayer insulating film. The first gate electrode is covered with the second gate electrode.

Basically, nonvolatile memories called "flash memory" can use the above-mentioned M(O)NOS transistor or the FG transistor as their nonvolatile storage element. In all the current mass-produced flash memories, however, only FG transistors are used as a nonvolatile storage element. However, the information charge holding characteristic of FG transistors theoretically recognized is not satisfactorily high, and there is a need to use a silicon oxide film having a comparatively large thickness of 9 nm or more as a tunnel oxide film between the semiconductor substrate major surface and the floating gate electrode. Therefore there is a limit to the reduction in the voltage for write/erase of information charge.

On the other hand, in MNOS transistors, the film thickness of the tunnel oxide film between the semiconductor substrate major surface and the silicon nitride film can easily be reduced, and a thin silicon oxide film of 3 nm or less can be used. Therefore, it is theoretically possible to reduce the operating voltage, particularly the voltage for write/erase of information charge. Operations for writing and erasing information charge in this type of nonvolatile storage element are as described below. That is, in MNOS transistors, information charge is written by injecting electrons from the semiconductor substrate into the above-mentioned interfacial region through a direct tunnel in a silicon oxide film about 2 nm thick formed on the semiconductor substrate major surface, and information charge is erased by a reverse operation, i.e., releasing electrons from the interfacial region to the semiconductor substrate. Such an interfacial region is formed of as an electron capture region. The written state of information charge in such a region corresponds to stored information "1", and the information charge erased state corresponds to stored information "0". In recent years, various studies have been energetically made for the purpose of putting M(O)NOS transistors theoretically considered capable of reducing the write/erase voltage to practical use as a storage element in nonvolatile memories such as flash memories.

For example, U.S. Pat. No. 5,768,192 discloses the basic structure of a nonvolatile storage element, which is an instance of a MONOS transistor used as a nonvolatile storage element in a flash memory. U.S. Pat. No. 5,966,603 recently made public discloses a technique relating to a nitride read only memory (NROM) as a technique enabling a nonvolatile memory manufacturing process to be advantageously simplified (hereinafter referred to as "first conventional art"). The basic structure of the nonvolatile memory according to this art is the same as that disclosed in above described U.S. Pat. No. 5,768,192.

Further, the structure of a nonvolatile storage element proposed in 2000 Symposium on VLSI Technology Digest of Technical Papers, pp. 122–123 (hereinafter referred to as "second conventional art") is known.

The first conventional art will be described with reference to FIGS. 21 to 24. The basic operation of the above-described MONOS will also be described. FIG. 21 is a plan view of a cell array of an NROM. FIGS. 22A to 22D are cross-sectional views taken along the line X—X shown in FIG. 21. FIGS. 22A to 22D show process steps for manufacturing the NROM. Description with reference to FIG. 21 will be made only of wiring in the cell array for ease of understanding.

In the cell array of the NROM, as shown in FIG. 21, a first diffusion layer 102, a second diffusion layer 103, a third diffusion layer 104, and so on are formed on a silicon substrate 101, and word lines (gate electrodes) 105, 106, and 107 are arranged perpendicularly to the diffusion layers. The diffusion layers form bit lines.

As shown in FIG. 22A, a first insulating film 108 is formed by thermal oxidation of a P-conduction type of silicon substrate 101, and a silicon nitride film is formed as a second insulating film 109 by chemical vapor deposition (CVD). After this film forming, a resist mask 110 having a diffusion layer pattern, which is a plan pattern of strips (strip pattern), is formed on the second insulating film 109 by a well-known lithography technique. The second insulating film 109 is then removed by etching. Thereafter, as shown in FIG. 22B, ions of an n-type impurity such as arsenic are implanted by using the resist mask 110 as anion implantation mask, and the resist mask 110 is removed, followed by a heat treatment. The first diffusion layer 102, the second diffusion layer 103 and the third diffusion layer 104 are thus formed in the surface of the silicon substrate 101.

Subsequently, the entire surface is subjected to thermal oxidation at a temperature of 750° C. or higher. As shown in FIG. 22C, a non-diffusion-layer insulating film 111 having a thickness of 100 nm is formed by this thermal oxidation on the surfaces of the first diffusion layer 102, the second diffusion layer 103 and the third diffusion layer 104. When this thermal oxidation is performed, the surface of the second insulating film 109 is also thermally oxidized to form a silicon oxide film as a third insulating film 112. Thus, a laminated insulating film of ONO structure constituted by the third insulating film 112 (silicon oxide film), the second insulating film 109 (silicon nitride film) and the first insulating film 108 (silicon oxide film) is formed.

Subsequently, a tungsten polycide film having a film thickness of about 200 nm is deposited as an electroconductive film on the entire surface and is processed by well-known lithography and dry etching techniques to form the word line 105.

Thus, as shown in FIG. 22D, bit lines for NROM cells are formed on the silicon substrate 101 by the first diffusion layer 102, the second diffusion layer 103, the third diffusion layer 104, and so on; information charge write/erase regions are formed by the first insulating film 108, the second insulating film 109 and the third insulating film 112 formed in the ONO structure; and the word lines 105, 106, and 107, also shown in FIG. 21, are arranged. A basic NROM cell structure is thus formed.

The basic operation of the MONOS transistor having the above-described NROM cell basic structure will be described. An operation for writing information charge (electrons in this case) is as described below. As shown in FIG. 23A, the silicon substrate 101 and the first diffusion layer 102, for example, are fixed at ground potential, $V_W$ of the second diffusion layer 103 is set to 1 to 2 V, and $V_{GW}$ of the gate electrode 105 is set to about 5 V. That is, the voltage settings are such that the MIS transistor operation of the MONOS transistor is in a linear characteristic condition. When these voltages are applied, an electron current 113 (channel current) is caused to flow from the first diffusion layer 102 functioning as the source to the second diffusion layer 103 functioning as the drain to generate channel hot electrons (CHE) in the vicinity of the second diffusion layer 103. Part of the channel hot electrons pass through the barrier formed by the first insulating film 108 to be captured in a region in the second insulating film 109. This region is shown as a capture region 114 in FIG. 12. Thus, in writing electrons, information charge is accumulated in a region in the second insulating film 109 near the end of the second diffusion layer 103.

An operation for reading information in the above-described MONOS transistor is as described below. As shown in FIG. 23B, voltage settings are made conversely to those described above, that is, the second diffusion layer 103 functioning as the source is fixed at ground potential, $V_R$ of the first diffusion layer 102 functioning as the drain is set to 1.5 V, and $V_{GR}$ of the gate electrode 105 is set to about 3 V. Also in this case the silicon substrate 101 has ground potential.

When read-out is performed in this manner in the case where the information as a result of write of electrons in the capture region 114 is "1", no current flows between the first diffusion layer 102 and the second diffusion layer 103. In contrast, in the case of information "0", i.e., in the case where no electrons are written in the capture region 114, a current flows between the first diffusion layer 102 and the second diffusion layer 103. Written information can be read in this manner.

An operation for erasing information in the above-described MONOS transistor is as described below. In the structure shown in FIG. 23A, the silicon substrate 101 and the first diffusion layer 102, for example, are fixed at ground potential, $V_E$ of the second diffusion layer 103 is set to 5 V, and $V_{GE}$ of the gate electrode 105 is set to about −5 V. When these voltages are applied, positive holes generated by interband tunneling caused by band bending in a region at the end of the second diffusion layer 103 corresponding to an overlap on the gate electrode 105 are injected into the above described capture region 114, thus erasing the information charge.

The above-described NROM can be designed so as to have a two-bit/one-cell configuration, as described below with reference to FIG. 24. As shown in FIG. 24, NROM cell bit lines are formed by a first diffusion layer 102, a second diffusion layer 103, etc., on a silicon substrate 101 and covered with an on-diffusion-layer insulating film 111, and information charge write/erase regions are formed by a first insulating film 108, a second insulating film 109 and a third insulating film 112 in an ONO structure. In the NROM, information charge write regions formed in two places, i.e., a first-bit capture region 114 and a second-bit capture region 115 formed as electron capture regions, are used. The operation in this case is basically the same as that described above with reference to FIGS. 23A and 23B. Thus, a multibit design can be made and NROM cells of the above-described two-bit/one-cell configuration can be provided.

The second conventional art will be described with reference to FIG. 25. FIG. 25 is a cross-sectional view of a cell array of a nonvolatile memory. This nonvolatile memory is characterized by forming word lines and control gate wiring in a memory cell array structure.

As shown in FIG. 25, a first diffusion layer 202, a second diffusion layer 203 and a third diffusion layer 204, which are $N^+$ diffusion layers, for example, are formed in a major surface of a silicon substrate 201 of a P-conduction type. First control gate electrodes 205, second control gate electrodes 206 and gate electrodes 207 are formed on the silicon substrate 201 generally in correspondence with the place between the first diffusion layer 202 and the second diffusion layer 203 and the place between the second diffusion layer 202 and the third diffusion layer 204, with an insulating film interposed between each gate electrode and the silicon substrate 201. In each memory cell, the first control gate electrode 205 and the second control gate electrode 206 are provided as the above-mentioned control gate wiring. The insulating film between each control gate electrode, i.e., the first (second) control gate electrode 205 or 206, and the silicon substrate 201 is an insulating film of an ONO structure similar to that in the first conventional art, i.e., a multilayer insulating film of an ONO structure formed of a first insulating film 208 (silicon oxide film), a second insulating film 209 (silicon nitride film) and a third insulating film 210 (silicon oxide film). The insulating film between each gate electrode 207 and the silicon substrate 201 is a single-layer silicon oxide film, which is formed of the first insulating film 208 (silicon oxide film), for example. The first (second) control gate electrode 205 or 206 and the gate electrodes 207 are also separated electrically from each other by the above-described insulating film in the ONO structure.

As shown in FIG. 25, an interlayer insulating film 211 is formed and a word line 212 is provided in a state of being connected to the above-described gate electrodes 207.

In the thus-constructed memory, information charge (electrons) is written to a capture region in the ONO structure below the first (second) control gate electrode 205 or 206 described above. When an operation for erasing information charge is performed, a voltage is applied between the first (second) control electrode 205 or 206 and the first (second) diffusion layer 202 or 203. Positive holes generated by interband tunneling such as that described with respect to the first conventional art are thereby injected into the above-described capture region.

In the nonvolatile storage element having the memory cell array of the NROM described above with respect to the first conventional art, the reduction in film thickness of the first insulating film 108, the second insulating film 109 and the third insulating film 112 is limited if a standard value of information charge accumulation holding time is ensured. The inventor of the present invention has made various trial experiments on fundamental characteristics of nonvolatile storage elements of the above-described MONOS structure, and has found that the lower limit of the thickness of insulating film of ONO structure necessary for ensuring an accumulation holding time of ten years, calculated in terms of silicon oxide film, is about 8 nm. It has also become clear that there is a limit to the increase in read-out speed in recent flash memories, which necessarily need an improvement in operating speed.

In the first conventional art, electrons written to the information charge capture region 114 drifts laterally in the second insulating film 109 formed of silicon nitride film inferior in insulating characteristic than silicon oxide film, as described above with reference to FIG. 23, so that the capture region expands with passage of time and the information charge holding characteristic becomes deteriorated. In a case where the NROM is made to operate in the two-bit/one-cell arrangement shown in FIG. 24, it is difficult to read out accumulated information if electrons written to the capture region 114 or 115 spread with passage of time. As described above, in a case where a nonvolatile storage element is made to operate in a multibit arrangement as in the case of NROM, the influence of only a slight change in electrons in the capture region with time is considerable. This is because, in the above-described case, the amount of electrons to be written is 500 to 1000 electrons and the electron capture region is considerably narrow, that is, the width from side to side is about 10 nm.

In the second conventional art, the MONOS transistor having control gate electrodes and the MOS transistor having a gate electrode are formed in one memory cell. The control gate electrodes are formed by side wall electroconductive film formed on side walls of the gate electrode. In this structure, the size of the control gate electrode in the channel direction can be reduced. Therefore, the effective channel length can be reduced to achieve an increase in the above mentioned speed of the read-out operation.

However, also in this case, the information charge capture region expends with passage of time for the same reason as that described above with respect to the first conventional art, resulting in deterioration in information charge holding characteristic.

BRIEF SUMMARY OF THE INVENTION

Summary of the Invention

In view of the above-described circumstances, an object of the present invention is to provide a nonvolatile semiconductor storage device having an improved information charge holding characteristic.

A nonvolatile semiconductor storage device according to the present invention has a semiconductor substrate, a gate electrode formed on a surface of the semiconductor substrate, and a first diffusion layer and a second diffusion layer formed in the surface of the semiconductor substrate on opposite sides of the gate electrode, a channel region being formed between the first and second diffusion layers, wherein a first insulating layer, isolated pieces of material and a second insulating layer are formed in order in a multilayer structure on the surface of the semiconductor substrate on the channel forming region.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
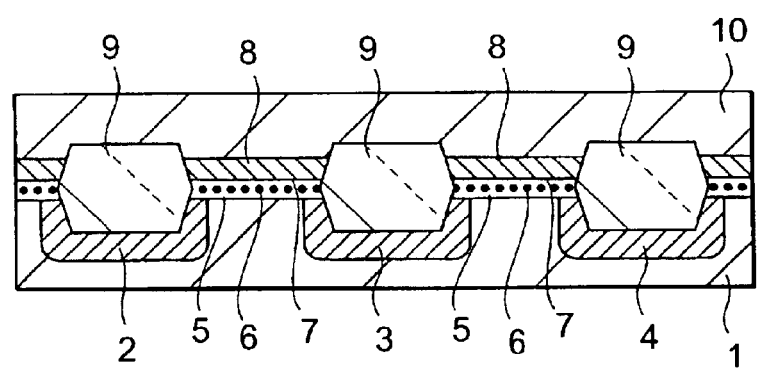
FIG. 1 is a cross-sectional view of a nonvolatile memory cell array which represents a first embodiment of the present invention.

A first embodiment of the present invention will be described with reference to FIGS. 1 to 3. FIG. 1 is a cross-sectional view of a memory cell array using a nonvolatile storage element in accordance with the present invention. FIGS. 2 and 3 are cross-sectional views and plan views of process steps for explaining a method of manufacturing the memory cell array.

As shown in FIG. 1, bit lines for non-volatile memory cells are formed, for example, on a P-conduction type of silicon substrate 1 by diffusion layers of an N-conduction type, i.e., a first diffusion layer 2, a second diffusion layer 3, a third diffusion layer 4, and so on, and information charge write/erase regions are formed by a first insulating film 5, isolated pieces of material 6 and a second insulating film 7. Gate electrodes 8 are formed so as to cover the second insulating film 7. An on-diffusion-layer insulating film 9 is formed on each of the first diffusion layer 2, the second diffusion layer 3 and the third diffusion layer 4, and word lines 10 are provided on the on-diffusion-layer insulating film 9 and connected to the gate electrodes 8, thus forming the basic structure of the nonvolatile memory cell in accordance with the present invention.

Figure 2A:
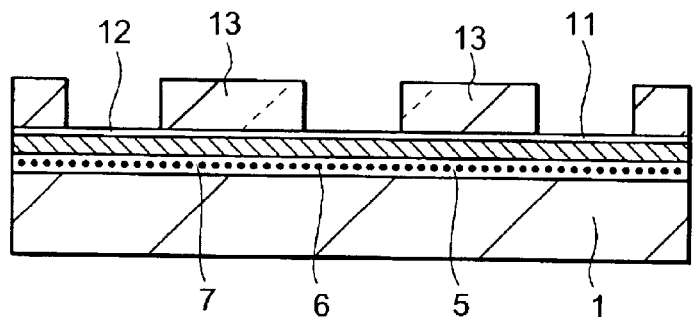
FIGS. 2A to 2D are cross-sectional views of process steps for manufacturing the nonvolatile memory cell array in the first embodiment of the present invention.

As shown in FIG. 2A, a first insulating film 5 having a film thickness of about 4 nm is formed on the silicon substrate 1 by radical oxidation or thermal oxidation. Isolated semispherical pieces of material 6 are then formed on the surface of the first insulating film 5. The isolated pieces of material 6 are semispherical pieces of silicon nitride having a diameter of about 3 nm. The semispherical pieces of silicon nitride can be produced by reduced-pressure CVD using a gas of dichlorosilane ($SiH_2cl_2$) and $NH_3$ as a reactive gas. If this gas is used, nucleation occurs at an early stage of film forming of silicon nitride film. Semispherical pieces of silicon nitride such as those mentioned above can be produced by stopping the film forming when the size of nuclei is increased to a predetermined value.

Alternatively, the above-described isolated pieces of material 6 may be semispherical pieces of silicon, silicon germanium or the like having a diameter of about 3 nm. In this case, isolated pieces of material 6 can be produced by reduced-pressure CVD using a silane gas or a germane gas as a reactive gas. In this reactive gas, nucleation occurs at an early stage of film forming of silicon film or silicon germanium film. Isolated pieces of material 6 are formed when the size of nuclei is increased to a suitable value.

After the above-described step, a silicon oxide film having a film thickness of about 5 nm is formed on the entire surface by CVD. It is preferable to form a high-temperature oxide (HTO) film as the silicon oxide film. In this manner, the second insulating film 7 is formed as a second insulating layer so as to completely cover the above-described isolated pieces of material 6.

Further, a first electroconductive film in a multilayer structure formed of a silicon layer 11 and a silicon nitride layer 12 is formed by deposition on the second insulating film 7. Thereafter, a resist mask 13 having a diffusion layer pattern, which is a pattern of strips, is formed on the silicon nitride layer 12 by a well-known lithography technique.

Figure 2B:
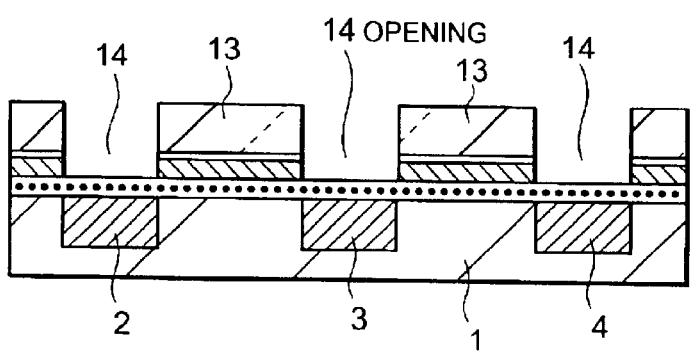

Subsequently, as shown in FIG. 2B, the above-described silicon nitride layer 12 and the silicon layer 11 are successively removed by etching based on a dry etching technique to form openings 14. Thereafter, as shown in FIG. 2B, ion implantation of an arsenic impurity is performed by using the resist mask 13 as an ion implantation mask, and the resist mask 13 is removed, followed by a heat treatment. The first diffusion layer 2, the second diffusion layer 3 and the third diffusion layer 4 are thereby formed in the surface of the silicon substrate 1.

Figure 2C:
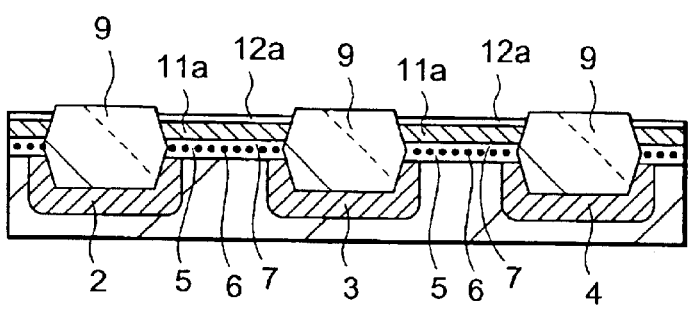

Subsequently, the entire surface is subjected to thermal oxidation, as is that in the conventional art. By this thermal oxidation, an on-diffusion-layer insulating film 9 having a film thickness of 100 nm is formed on the surfaces of the first diffusion layer 9, the second diffusion layer 3 and the third diffusion layer 4, as shown in FIG. 2C.

Thus, an insulating film is formed which is formed of second insulating film 7, isolated pieces of material 6 and first insulating film 5. In this process step, a silicon layer 11a and a silicon nitride layer 12a are formed in a strip pattern on the second insulating film 7. The silicon nitride layer 12a in the strip pattern is then removed by etching and an n-type impurity is introduced into the silicon layer 11a in the strip pattern.

Figure 2D:
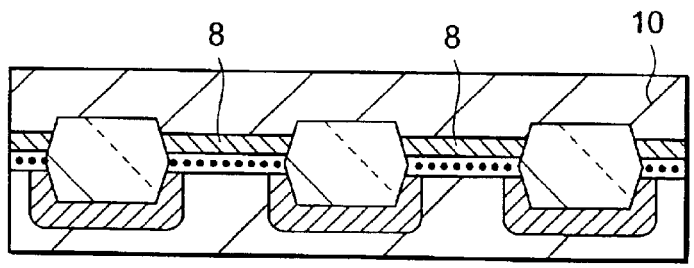

Subsequently, as shown in FIG. 2D, an electroconductive film such as tungsten silicide film having a film thickness of about 200 nm is deposited as a second electroconductive film on the entire surface and is processed by well-known lithography and dry etching techniques to form word lines 10. In this word line 10 forming step, the silicon layer 11a in the strip pattern is also processed to form gate electrodes 8. Thus, the basic structure of the nonvolatile memory cells described with reference to FIG. 1 is completed.

Figure 3A:
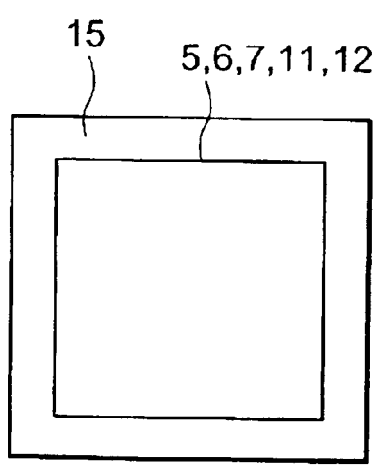
FIGS. 3A to 3D are plan views of process steps for manufacturing the nonvolatile memory cell array.

The above-described manufacturing method will be described briefly with reference to the plan views. As shown in FIG. 3A, an element separation region 15 is formed in a predetermined region of the silicon substrate, and nonvolatile memory cells are formed in an active region inside the element separation region 15. In the step described with reference to FIG. 2A, the first insulating film 5, the layer of isolated pieces of material 6, the second insulating film 7, the silicon layer 11 and the silicon nitride layer 12 are formed one on another.

Figure 3B:
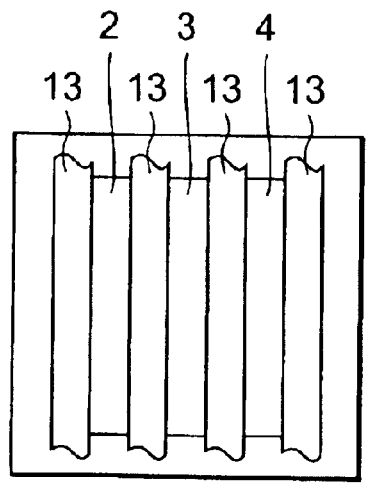

Subsequently, in the step shown in FIG. 3B, the resist mask 13 in the strip pattern, the first diffusion layer 2, the second diffusion layer 3 and the third diffusion layer 4 are formed. This step corresponds to the step shown in FIG. 2B.

Figure 3C:
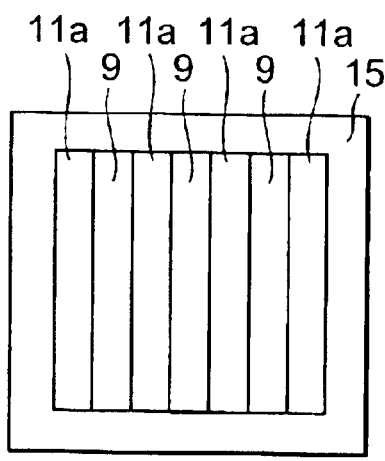

In the step shown in FIG. 3C, the resist mask 13 is removed and the on-diffusion-layer insulating film 9 is formed on each of the diffusion layers by thermal oxidation. In this step, the silicon layer 11a is formed in the strip pattern. This step corresponds to the step shown in FIG. 2C.

Figure 3D:
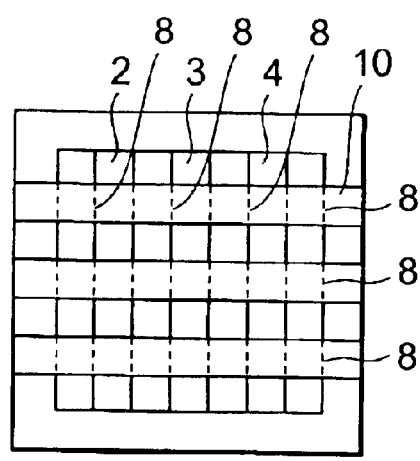

In the step shown in FIG. 3D, the electroconductive film deposited on the entire surface as described above and the silicon layer 11a in the strip pattern are processed to form the word lines 10 and the gate electrodes 8. Thus, the bit lines formed by the first diffusion layer 2, the second diffusion layer 3 and the third diffusion layer 4 and the word lines 10 are arranged perpendicularly to each other.

The advantage of the above-described first embodiment will be described below in correspondence with that of a second embodiment of the present invention.

The second embodiment of the present invention will be described with reference to FIGS. 4A to 4D. FIGS. 4A to 4D are cross sectional views of a nonvolatile memory cell array to which the present invention is applied, showing process steps for manufacturing the memory cell array. The structure in this embodiment of the present invention is the same as that described above. In this embodiment, the on-diffusion-layer insulating film is formed by using a method of embedding insulating film by CVD instead of thermal oxidation described in the description of the first embodiment. The same components as those in the first embodiment are indicated by the same reference characters.

Figure 4A:
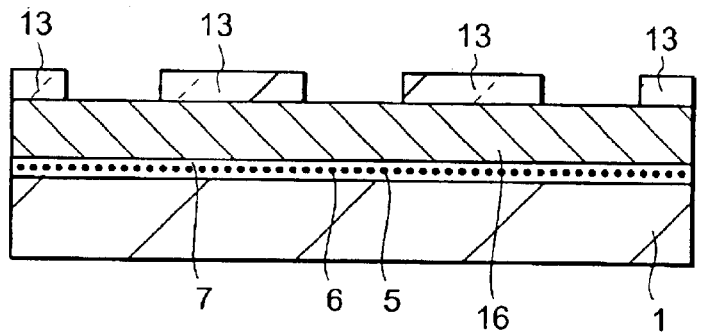
FIGS. 4A to 4D are cross-sectional views of process steps for manufacturing a nonvolatile memory cell array which represents a second embodiment of the present invention.

As shown in FIG. 4A, a first insulating film 5 having a film thickness of about 4 nm and formed of a silicon oxide film is formed on a silicon substrate 1 by radical oxidation, thermal oxidation or the like, as is that in the first embodiment. Isolated pieces of material 6 are then formed on the first insulating film 5, as described above with respect to the first embodiment. A second insulating film 7 formed of a silicon oxide film having a film thickness of about 5 nm is formed so as to cover the isolated pieces of material 6.

Further, an electroconductive film 16 is deposited as a first electroconductive film by CVD so as to cover the second insulating film 7. The electroconductive film 16 is an amorphous silicon film, a polycrystal silicon film or a silicon germanium film having a film thickness of about 200 nm and containing an n-type impurity.

Figure 4B:
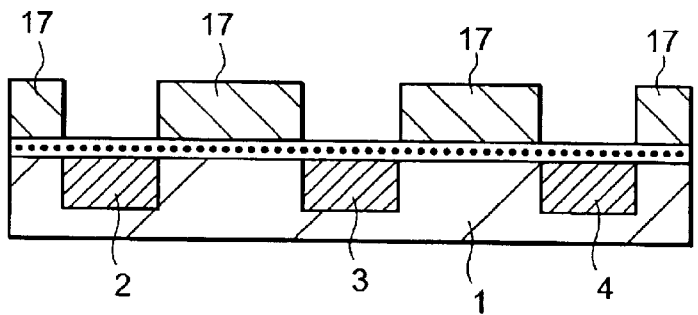

Subsequently, a resist mask 13 having a diffusion layer pattern, which is a pattern of strips, is formed on the electroconductive film 16 by a lithography technique. Then, as shown in FIG. 4B, the electroconductive film 16 is processed by a dry etching technique to form gate electrodes 17 in the form of strips corresponding to the strip pattern, and the resist mask 13 is removed. Thereafter, ion implantation of an arsenic impurity is performed by using the gate electrodes 17 in the form of strips as an ion implantation mask, followed by a heat treatment. A first diffusion layer 2, a second diffusion layer 3 and a third diffusion layer 4 are thereby formed in the surface of the silicon substrate 1.

Figure 4C:
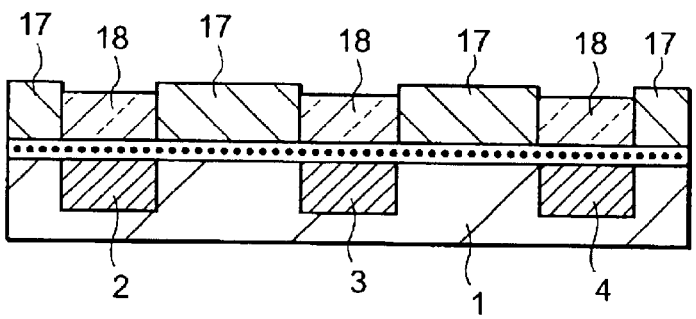

Subsequently, a silicon oxide film having a film thickness of about 300 nm is formed on the entire surface by CVD. The silicon oxide film is polished by chemical mechanical polishing (CMP) and by using the gate electrodes 17 in the form of strips as a polishing stopper to remove unnecessary portions. In the film forming of the silicon oxide film by CVD, a gas of monosilane (SiH$_4$) and dinitrogen monoxide (N$_2$O) is used as a reactive gas and a high film forming temperature of 700 to 800° C. is set. That is, HTO film is formed. In this manner, an on-diffusion-layer insulating film 18 having a film thickness of about 200 nm is formed on each of the first diffusion layer 2, the second diffusion layer 3 and the third diffusion layer 4, as shown in FIG. 4C. This HTO film has an improved step covering characteristic and is, therefore, capable of completely filling the spaces between the gate electrodes 17 in the form of strips. Moreover, the HTO film has a markedly high insulating property and quality.

Figure 4D:
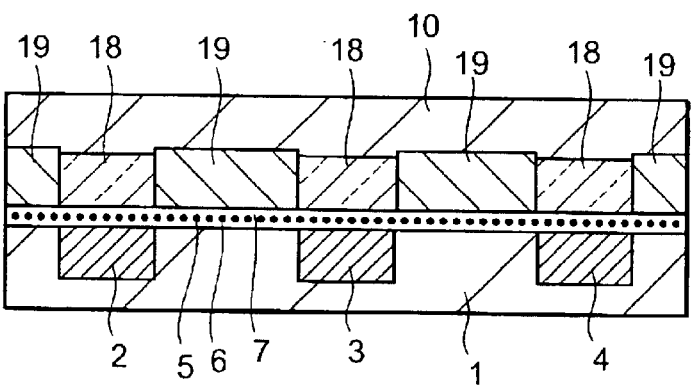

Subsequently, as shown in FIG. 4D, a tungsten silicide film having a film thickness of about 200 nm is deposited as a second electroconductive film on the entire surface and is processed by well-known lithography and dry etching techniques to form word lines 10. In this word line 10 forming step, the gate electrodes 17 in the form of strips are also processed to form gate electrodes 19.

As shown in FIG. 4D, the bit lines for the nonvolatile memory cells are formed by the first diffusion layer 2, the second diffusion layer 3, the third diffusion layer 4, and so on; information charge write/erase regions are formed by the first insulating film 5, the isolated pieces of material 6 and the second insulating film 7, and the word lines 10 are arranged, thus completing the basic structure of the nonvolatile memory cells in accordance with the present invention.

In the above-described second embodiment, the same advantage as that of the first embodiment (described below) is obtained. In this case, the amount of lateral biting by the on-diffusion-layer insulating film 18 is substantially zero. Also, the film thickness of the on-diffusion-layer insulating film 18 can easily be increased. Therefore, the parasitic capacitance between the bit lines and word lines for the nonvolatile memory cells can be remarkably reduced.

Figure 5:
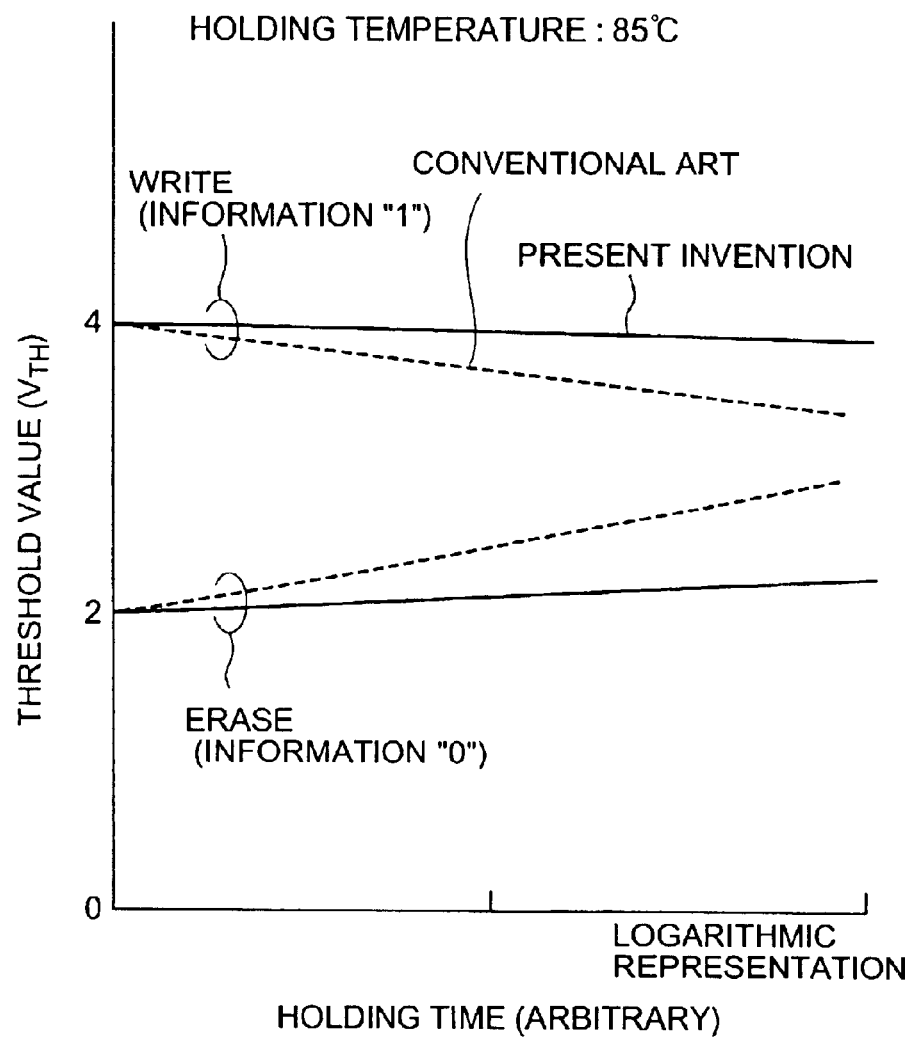
FIG. 5 is a graph showing information charge holding characteristics for explaining the advantage in the embodiment of the present invention.

A noticeable advantage of the above-described first and second embodiments resides in a significant improvement in information charge holding characteristic. Description will be made of this advantage with reference to FIG. 5. In FIG. 5, information charge holding time is logarithmically plotted along the abscissa, while threshold values of the MIS transistor corresponding to the nonvolatile storage element in accordance with the present invention are plotted along the ordinate. A case of the conventional art is indicated by the broken line, while a case of the present invention is indicated by the solid line. As shown in FIG. 5, in a case where information is held when information charge is erased and when the threshold value is set to 2 V, the threshold value increases with the holding time. In the conventional art, the rate of increase in the threshold value under this condition is considerably high. In contrast, in the case of the present invention, substantially no change in threshold value is exhibited. In a case where information is held when information charge is written and when the threshold value is set to 4 V, the threshold value decreases with the holding time. In the conventional art, the rate of decrease in the threshold value under this condition is considerably high. In contrast, in the case of the present invention, substantially no change in threshold value is exhibited. Thus, the present invention remarkably improves the information charge holding characteristic of the nonvolatile storage element.

Figure 6:
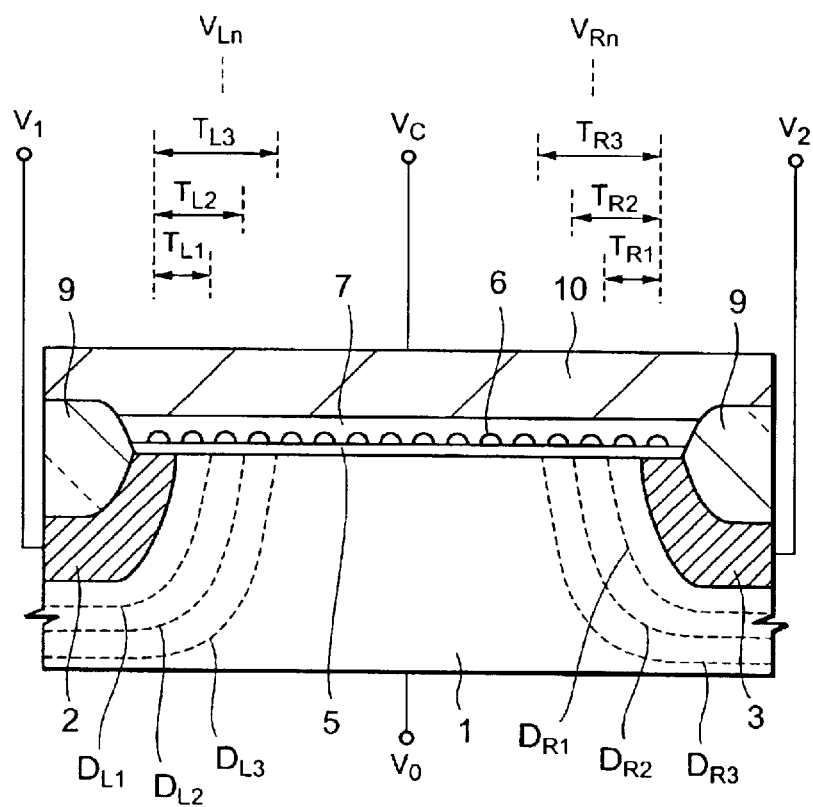
FIG. 6 is a cross-sectional view of a portion of a nonvolatile storage element for explaining the mechanism of production of the effect described in an embodiment of the present invention.

The mechanism of production of the effect of improving the information charge holding characteristic will be described with reference to FIG. 6. The possibility of a multibit/one-cell configuration of the nonvolatile memory cell structure in accordance with the present invention will also be described. FIG. 6 is a schematic cross-sectional view of the nonvolatile storage element of the present invention.

As shown in FIG. 6, first and second diffusion layers 2 and 3 of an N-conduction type are formed on silicon substrate 1 of a P-conduction type. A silicon oxide film is formed as the first insulating film 5 on a channel region of the nonvolatile storage element, and the above-described isolated pieces of material 6 made of a silicon material such as a silicon nitride are formed on the surface of the first insulating film 5. The isolated pieces of material 6 are completely covered with a silicon oxide film formed as the second insulating film 7.

In this case, an information charge write region (capture region) is formed in correspondence with a trap center in the isolated pieces of material 6 or an interfacial region around some of the isolated pieces of material 6 at the interface between the first insulating film 5 and the second insulating film 7. Thus, the capture region is completely separated from the substrate, etc., by the first and second insulating films 5 and 7 having a high insulating property. Therefore, electrons written to the isolated pieces of material 6 are confined in the capture region, and the information charge holding characteristic is remarkably improved.

In the conventional art, the electron capture region is formed in the second insulating film formed of a silicon nitride film. In the case of this capture region, however, written electrons can easily drift laterally, as described above with respect to the problem of the conventional art. According to the present invention, isolated pieces of material 6 forming an electron capture region are completely covered with a silicon oxide film having a degree of insulation $10^3$ to $10^4$ times higher than that of a silicon nitride film. Therefore, the above-mentioned drift of electrons is effectively reduced and the above-described advantage is obtained.

Thus, written electrons are completely confined at isolated pieces of material 6 in the above-described nonvolatile storage element structure in accordance with the present invention. If this characteristic is utilized, it is possible to obtain a multibit/one-cell configuration, as described below.

As shown in FIG. 6, in a region adjacent to the first diffusion layer 2, electron capture regions are respectively formed at the isolated pieces of materials 6 existing in a first left range $T_{L1}$, a second left range $T_{L2}$, a third left range $T_{L3}$, . . . the nth left range $T_{Ln}$. Similarly, in a region adjacent to the second diffusion layer 3, electron capture regions may be respectively formed at the isolated pieces of materials 6 existing in a first right range $T_{R1}$, a second right range $T_{R2}$, a third right range $T_{R3}$, . . . the nth right range $T_{Rn}$. A multiplicity of regions for capturing and storing electrodes may be provided in this manner to obtain a multibit/one-cell configuration. In the above-described multibit/one-cell configuration, information charge capture regions are formed as regions close to the first diffusion layer 2 and/or regions close to the second diffusion layer 3.

A method of writing information charge (electrons) to a plurality of regions in the above-described multiple-bit element will be described.

When electrons are written to the second above-mentioned first left range $T_{L1}$ region, $V_2$ is set to 0 V and $V_1$ is set to a low value under a condition: $V_1 \geq V_G$. The nonvolatile storage element shown in FIG. 6 is thereby brought into MIS transistor operation in a saturated characteristic condition. The portion on the first diffusion layer 2 side is pinched off to form a depletion layer $D_{L1}$, and electrons thereby produced as CHE are injected into the left range $T_{L1}$ region, thus writing electrons to this region. When electrons are written to the second left range $T_{L2}$ region, $V_2$ is set to 0 V and $V_1$ is set to a higher value under a condition: $V_1 \geq V_G$. A depletion layer $D_{L2}$ is thereby formed and electrons are written to the left range $T_{L2}$ region. The voltage value of $V_1$ is successively increased to write electrons to the third left range $T_{L3}$ region, . . . the nth left range $T_{Ln}$ region.

Similarly, when electrons are written to the first right range $T_{R1}$ region, $V_1$ is set to 0 V and $V_2$ is set to a low value under a condition: $V_2 \geq V_G$. The nonvolatile storage element shown in FIG. 6 is thereby brought into MIS transistor operation in a saturated characteristic condition. The portion on the second diffusion layer 3 side is pinched off to form a depletion layer $D_{R1}$, and electrons thereby produced as CHE are injected into the right range $T_{R1}$ region, thus writing electrons to this region. When electrons are written to the second right range $T_{R2}$ region, $V_1$ is set to 0 V and $V_2$ is set to a higher value under a condition: $V_2 \geq V_G$. A depletion layer $D_{R2}$ is thereby formed and electrons are written to the right range $T_{R2}$ region. The voltage value of $V_2$ is successively increased to write electrons to the third right range $T_{R3}$ region, . . . the nth right range $T_{Rn}$ region.

The operation of the element in the multibit/one-cell configuration can be performed in the above-described manner. The impurity concentration in a silicon substrate 1 region close to the first (second) diffusion layer 2 or 3 may be varied to control the value of the above-described depletion layer. The width of the deletion layer can easily be controlled in this manner.

Figure 23A:
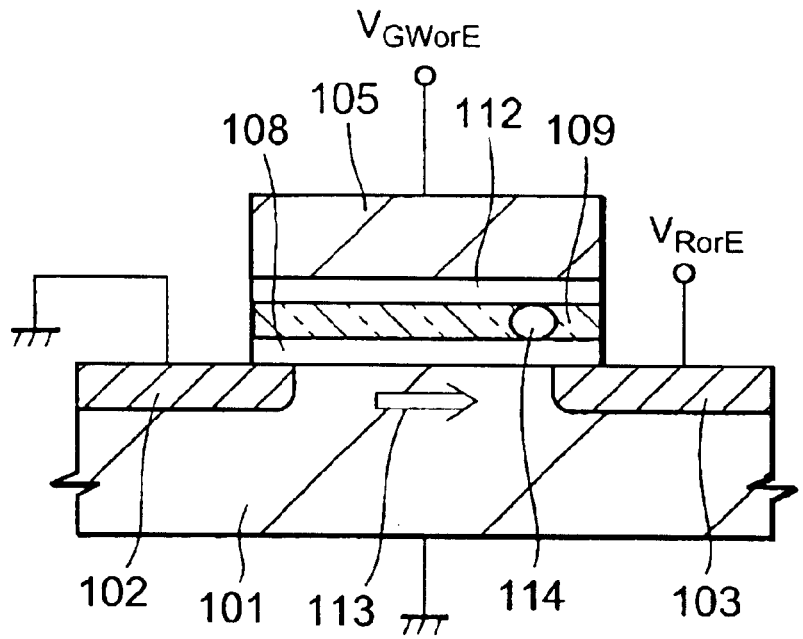
FIGS. 23A and 23B are cross-sectional views of the nonvolatile storage element for explaining the operation of the storage element.
Figure 23B:
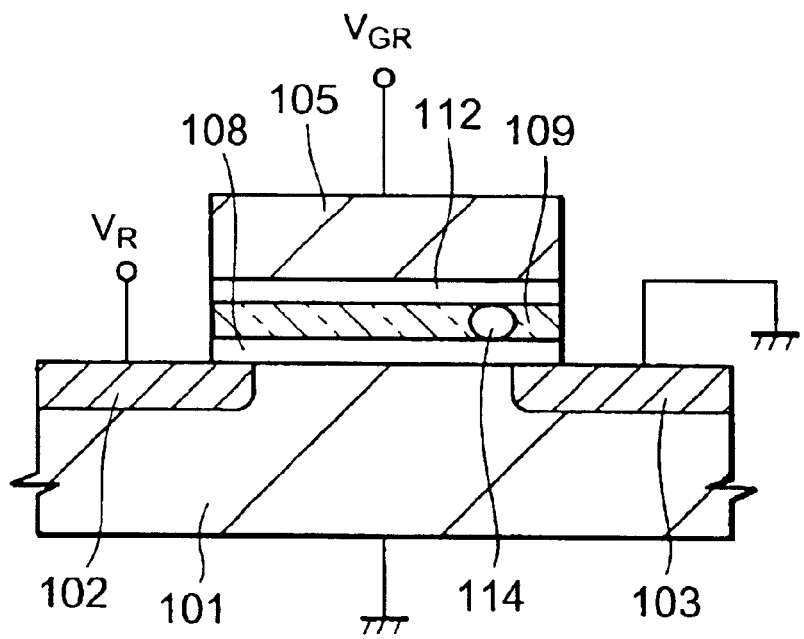
Figure 24:
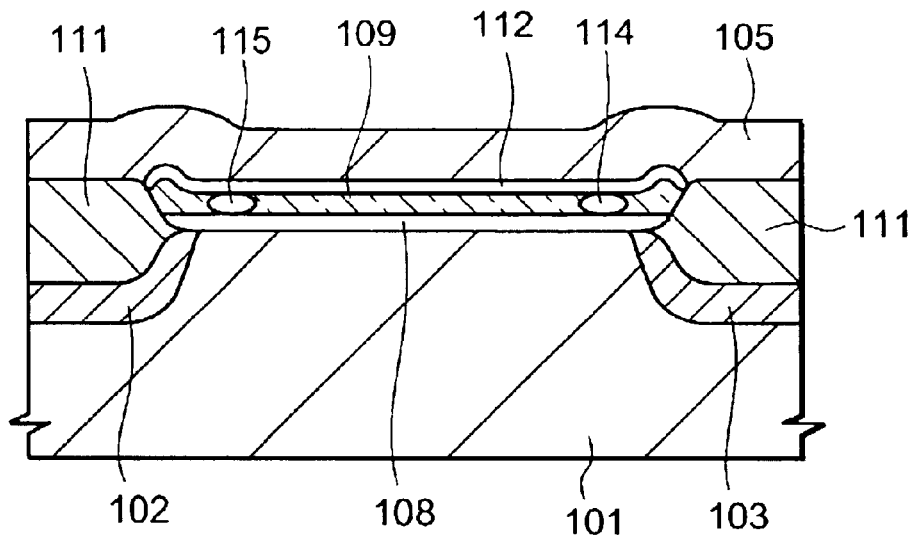
FIG. 24 is a cross-sectional view of the NROM cell for explaining the operation of the NROM cell.
Figure 25:
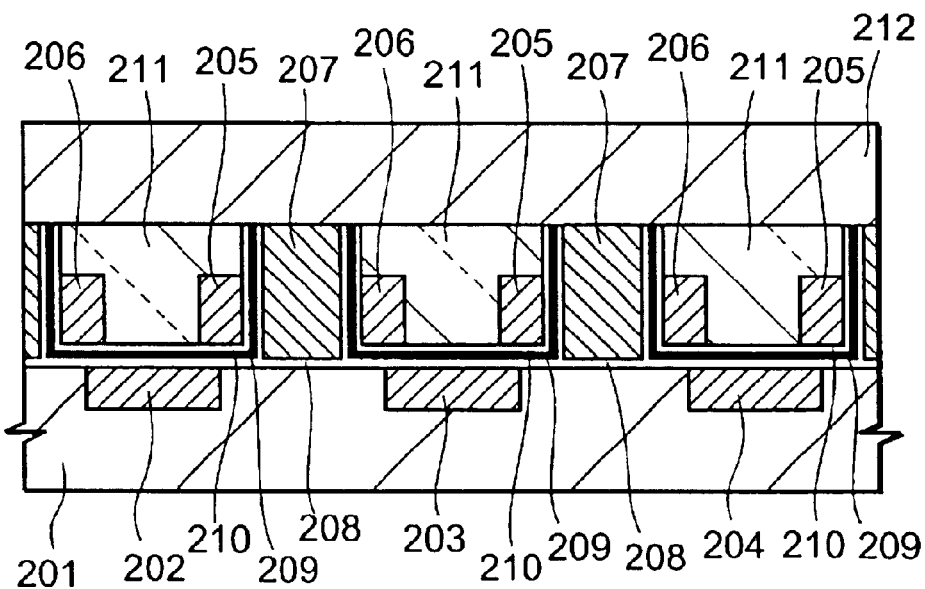
FIG. 25 is a cross-sectional view of a nonvolatile memory cell array for explaining a second conventional art.

Read-out of information from the above-described nonvolatile storage element is basically the same as that described as an operation in the conventional art with reference to FIG. 23B. In this case, however, the driving ability of the above-described nonvolatile storage element during linear-characteristic operation is sensed and a signal indicating the drive ability is amplified to recognize the driving ability.

Thus, the nonvolatile memory cell is designed to perform a multibit/one-cell operation to promote the development of nonvolatile semiconductor storage devices having a higher density or a higher capacity. Further, the development of multifunctional semiconductor devices in which the storage element is mounted together with a logic circuit or a memory circuit.

In the case of reading information in the conventional art, degradation of information in one memory cell can occur easily when read from another memory cell is performed. In such a situation, as mentioned above, the MIS transistor operation of the nonvolatile storage element at the time of write of information to one memory cell is in a linear characteristic condition, as it is at the time of read. Also, write of a small amount of electrons to another memory cell can occur easily, as mentioned above, and, therefore, read disturb can occur easily.

During the read-out operation of the nonvolatile semiconductor storage device of the present invention, the MIS transistor operation of the nonvolatile storage element at the time of write of information to one memory cell is in a linear characteristic condition, as is that in the conventional art described above with reference to FIG. 23B. According to the present invention, however, information charge write regions are formed by isolated pieces of material, which are discontinuous capture regions. Therefore, even if electrons are injected to one memory cell when the operation for read from another memory cell is being performed, the probability of the electrons being captured is effectively reduced relative to that in the case of the conventional art, so that the read disturb can be effectively limited. When the nonvolatile storage element is brought into MIS transistor operation in a saturated characteristic condition at the time of write of information charge described above with reference to FIG. 6, the amount of injection of electrons into the capture regions is increased and the necessary amount of electrons can be captured. In the nonvolatile semiconductor storage device of the present invention, the MIS transistor operation of the nonvolatile storage element at the time of the above-mentioned write may alternatively be in a linear characteristic condition.

As the erasing operation of the nonvolatile semiconductor storage device, the same operation as that described above with reference to the conventional art, i.e., erasing information charge by positive holes generated by interband tunneling, is performed.

Figure 7A:
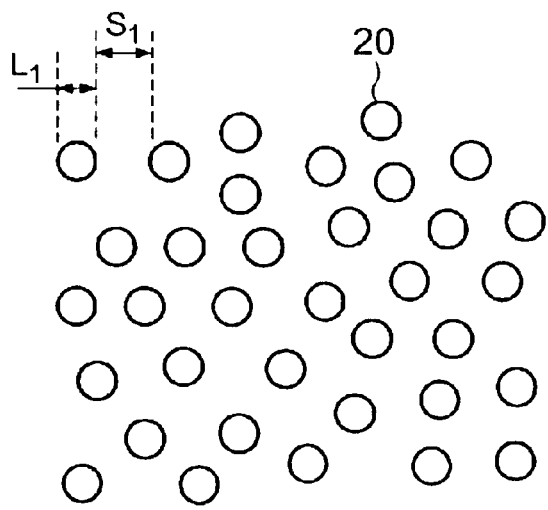
FIGS. 7A and 7B are plan views showing configurations of isolated pieces of material in accordance with the present invention.
Figure 7B:
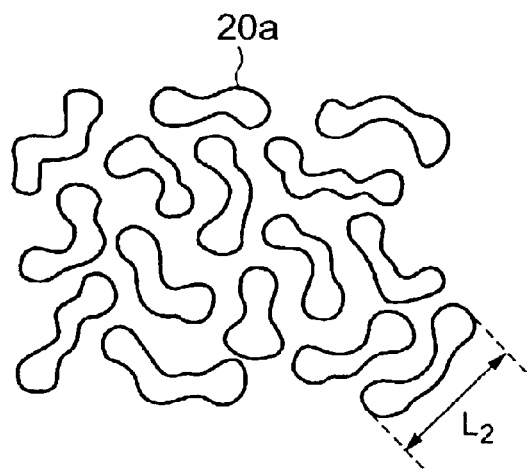

As the above-described isolated pieces of material in accordance with the present invention, pieces of material may suffice which are discontinuously formed on the first insulating film 5 so as to be isolated from each other, and which are separable from each other by the second insulating film 7. Typical examples of such isolated pieces of material are isolated semispherical pieces of material 20 shown in FIG. 7A and isolated land-like pieces of material 20a shown in FIG. 7B. The inventor of the present invention performed various simulations with respect to the diameter L1 and isolated piece spacing S1 of the illustrated spherical pieces of material 20, and thereby found that a preferable value of L1 and a preferable value of the isolated piece spacing S1 according to information charge write and read characteristics are in the range from 1 to 10 nm and in the range from 2 to 5 nm, respectively. Also, it is preferable to set the value of the maximum size L2 of the isolated land-like pieces of material 20a to 15 nm or less. The isolated pieces of material may have a column-like structure other than those described above.

Figure 8:
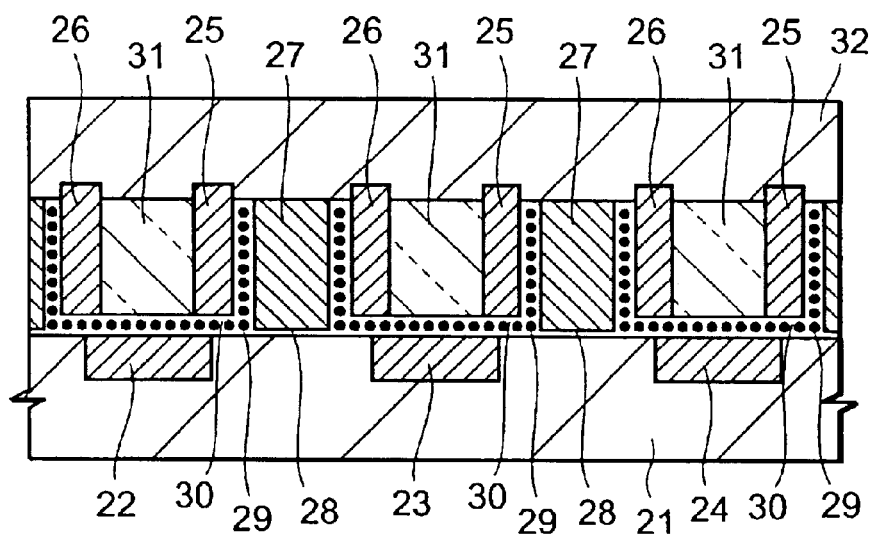
FIG. 8 is a cross-sectional view of a nonvolatile memory cell array which represents a third embodiment of the present invention.

A third embodiment of the present invention will be described with reference to FIGS. 8 to 10. FIG. 8 is a cross-sectional view of a memory cell array using a non-volatile storage element in accordance with the present invention. FIGS. 9A, 9B, and 9C, and FIGS. 10A, 10B, and 10C are cross-sectional views of the memory cell array for explaining an example of process steps for manufacturing the memory cell array.

As shown in FIG. 8, a first diffusion layer 22, a second diffusion layer 23 and a third diffusion layer 24, which are $N^+$ diffusion layers, for example, are formed in a major surface of a silicon substrate 21 of a P-conduction type. First side wall gate electrodes 25, second side wall gate electrodes 26 and gate electrodes 27 are formed on the silicon substrate 21 generally in correspondence with the place between the first diffusion layer 22 and the second diffusion layer 23 and the place between the second diffusion layer 23 and the third diffusion layer 24, with an insulating film interposed between each gate electrode and the silicon substrate 21. As shown in FIG. 8, a multilayer insulating film formed of a first insulating film 28 (silicon oxide film), isolated pieces of material 29 and a second insulating film 30 is formed between each side wall gate electrode, i.e., the first (second) sidewall gate electrode 25 or 26, and the silicon substrate 21. The insulating film between each gate electrode 27 and the silicon substrate 21 is a single-layer silicon oxide film, which is formed of the first insulating film 28 (silicon oxide film) in this embodiment. The first (second) side wall gate electrode 25 or 26 and the gate electrodes 27 are also separated electrically from each other by the above-described multilayer insulating film.

An on-diffusion layer insulating film 31 is formed, and word lines 32 are arranged in a state of being connected to the first side wall gate electrodes 25, the second side wall gate electrodes 26 and the gate electrodes 27. Also in this embodiment, as well as in the above-described first and second embodiments, a noticeable advantage of effectively improving the information charge holding characteristic can be obtained. In this embodiment, the speed of the operation for reading out information from the memory cell is increased.

A method of manufacturing the memory cell array using the above-described nonvolatile storage element will be described.

Figure 9A:
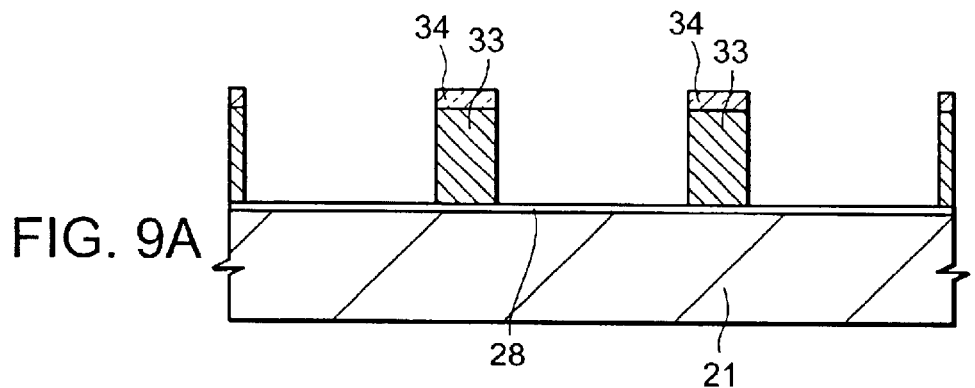
FIGS. 9A, 9B, and 9C are cross-sectional views of process steps for manufacturing the nonvolatile memory cell array in the third embodiment of the present invention.
Figure 10A:
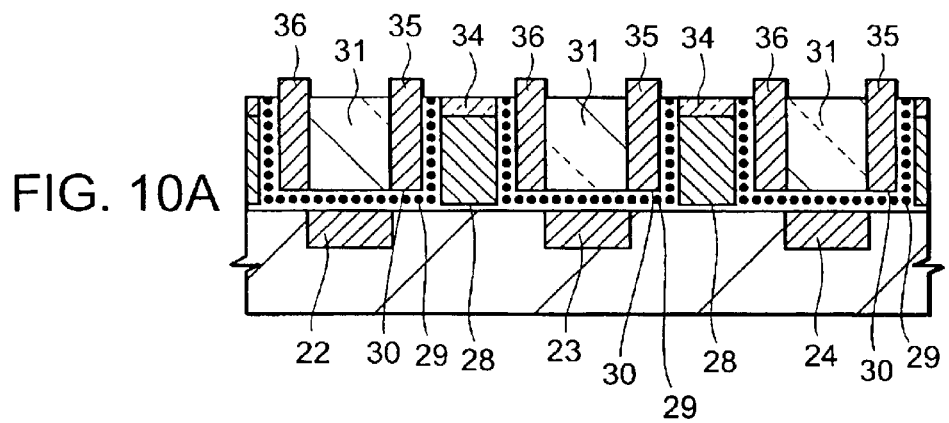
FIGS. 10A, 10B, and 10C are cross-sectional views of manufacturing process steps continued from FIG. 8.
Figure 10B:
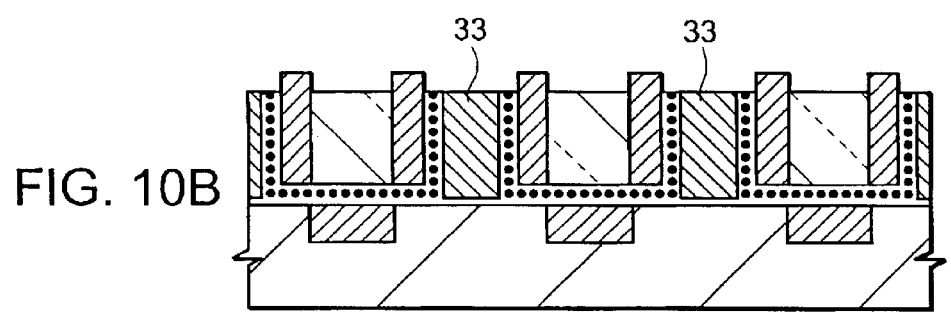

As shown in FIG. 9A, a first insulating film 28 is formed on silicon substrate 21 by radical oxidation. Gate electrodes 33 in the form of strips and cap insulating film 34 are formed in predetermined regions on the first insulating film 28 by well-known photolithography and dry etching techniques. The gate electrodes 33 in the form of strips are formed from polycrystal silicon containing a phosphorus (arsenic) impurity, while the cap insulating film 34 is formed of a silicon nitride film.

Figure 9B:
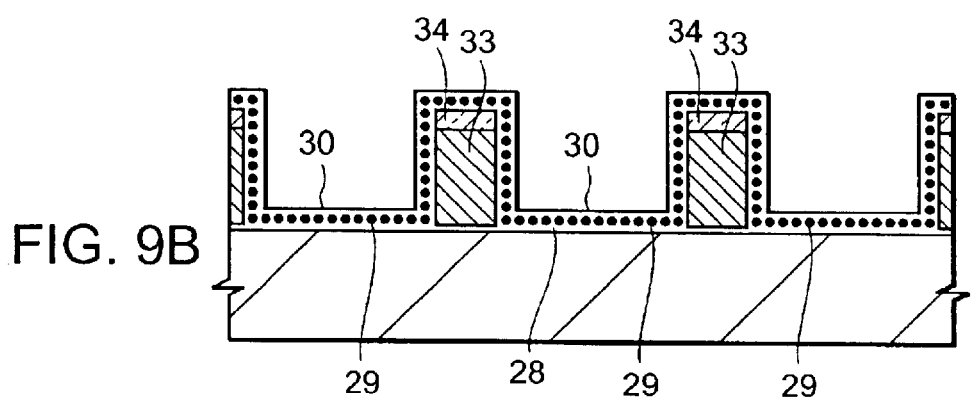

Subsequently, as shown in FIG. 9B, the entire surface is subjected to radical oxidation. The first insulating film 28 is thereby formed also on the side surfaces of the gate electrodes 33 in the form of strips and on the surface of the cap insulating film 34.

Isolated pieces of material 29 each having a spherical shape, for example, are then formed on the surface of the first insulating film 28, as described above with respect to the first embodiment. For example, the isolated pieces of material 29 are semispherical pieces of silicon nitride or semispherical pieces of silicon, silicon germanium or the like having a diameter of about 3 nm.

Thereafter, a silicon oxide film is formed on the entire surface by CVD. It is preferable to form an HTO film as the silicon oxide film. The second insulating film 30 is thereby formed so as to completely cover the isolated pieces of material 29.

Figure 9C:
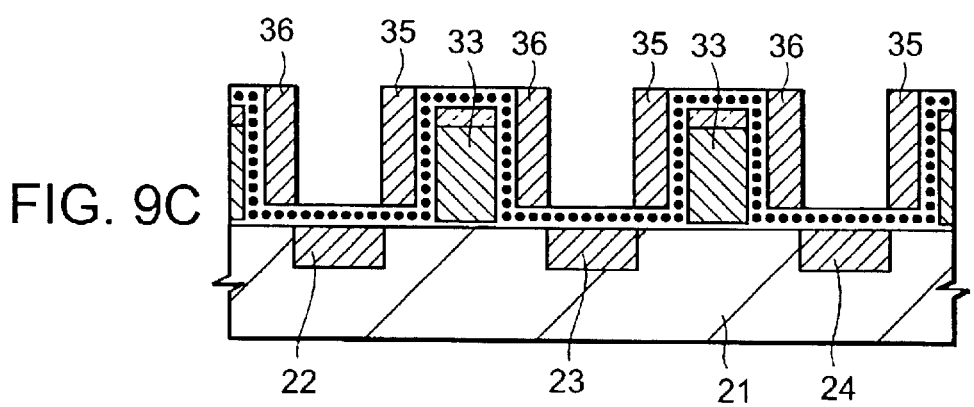

Subsequently, as shown in FIG. 9C, first side wall gate electrodes 35 in the form of strips and second wall gate electrodes 36 in the form of strips are formed along side portions of the gate electrodes 33 in the form of strips by forming a polycrystal silicon film containing a phosphorous (arsenic) impurity on the entire surface and by etching back the polycrystal silicon film. Thereafter, ion implantation of an arsenic impurity is performed by using the above-described gate electrodes 33 in the form of strips, first side wall gate electrodes 35 in the form of strips and second side wall gate electrodes 36 in the form of strips as an ion implantation mask, followed by a heat treatment. The first diffusion layer 22, the second diffusion layer 23 and the third diffusion layer 24 are thereby formed in the surface of the silicon substrate 21.

Subsequently, an HTO film having a film thickness of about 300 nm is formed on the entire surface by CVD. The above-described silicon oxide film, second insulating film 30, isolated pieces of material 29 and first insulating film 28 are polished by CMP and by using the cap insulating film 33 or the first side wall gate electrodes 35 in the form of strips and the second side wall gate electrodes 36 in the form of strips as a polishing stopper to remove unnecessary portions. In this manner, the on-diffusion-layer insulating film 31 having a film thickness of about 200 nm is formed on each of the first diffusion layer 22, the second diffusion layer 23 and the third diffusion layer 24, as shown in FIG. 10A. After this film forming the cap insulating film 34 is removed by CMP or the like to expose the gate electrodes 33 in the form of strips.

Figure 10C:
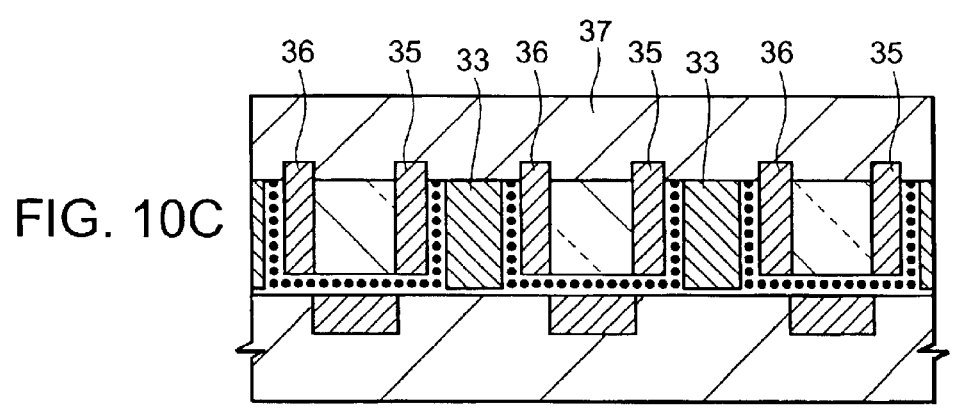

Subsequently, as shown in FIG. 10C, a tungsten silicide film having a film thickness of about 200 nm is deposited as a second electroconductive film on the entire surface to form an electroconductive film 37 connected to the gate electrodes 33 in the form of strips, the first side wall gate electrodes 35 in the form of strips and the second side wall gate electrodes 36 in the form of strips. The gate electrodes 33 in the form of strips, the first side wall gate electrodes 35 in the form of strips and the second side wall gate electrodes 36 in the form of strips are simultaneously processed by well-known lithography and dry etching techniques to form the first side wall gate electrodes 25 and the second side wall gate electrodes 26 as well as the word lines 32 described above with reference to FIG. 8, thus completing the memory cell array described with reference to FIG. 8.

Figure 11A:
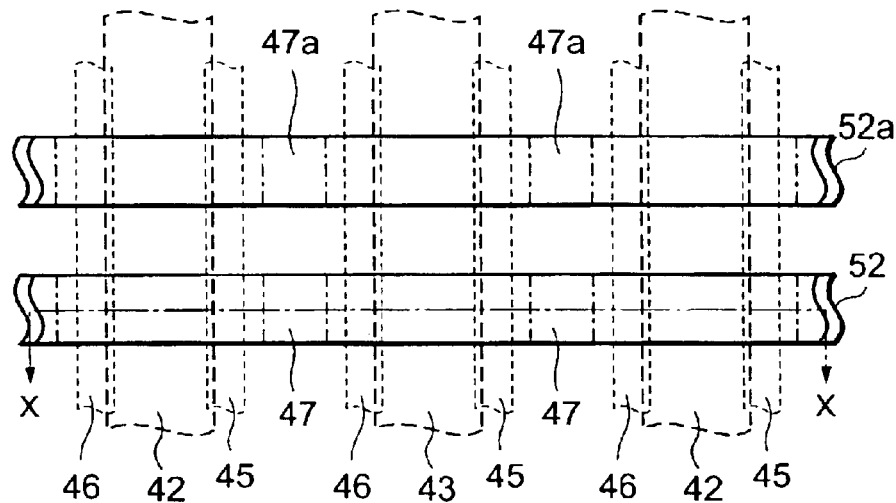
FIGS. 11A and 11B are a plan view and a cross-sectional view, respectively, of a nonvolatile memory cell array which represents a fourth embodiment of the present invention.
Figure 11B:
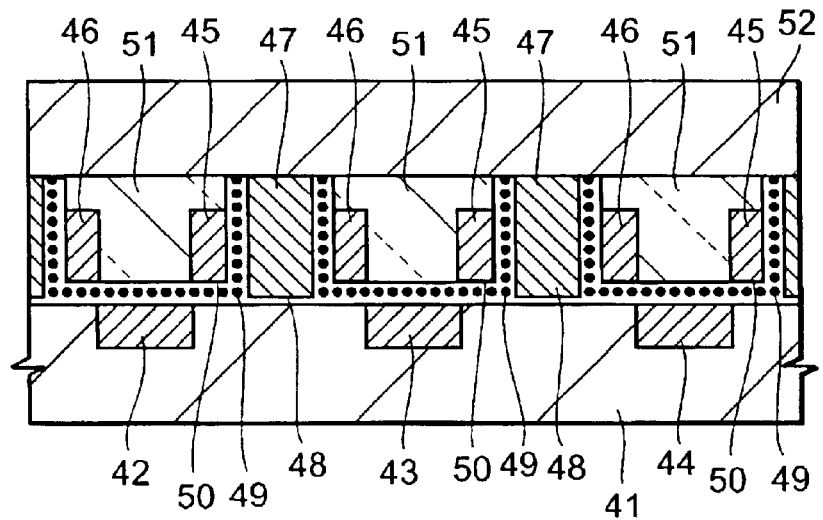
Figure 12A:
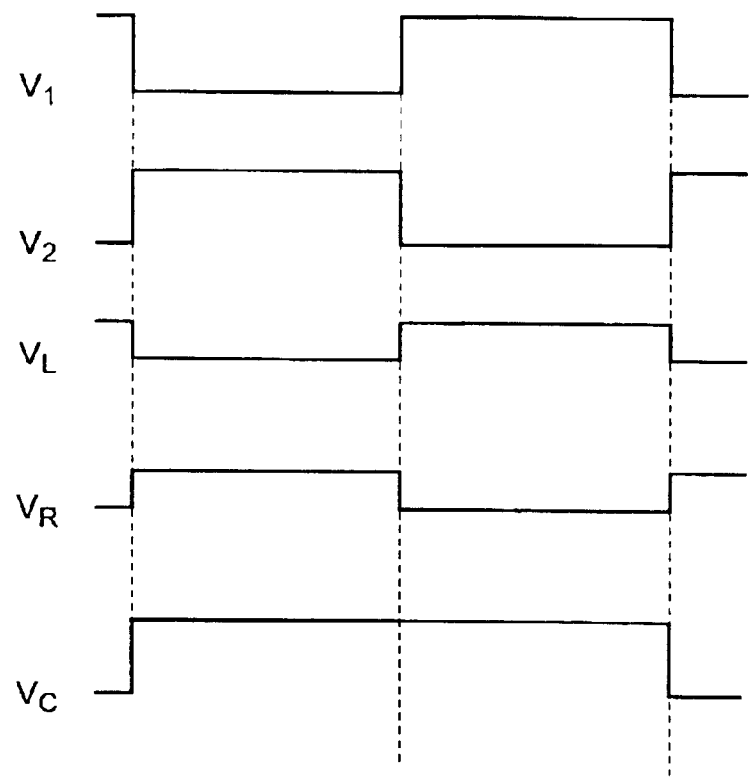
FIG. 12A is a timing chart of information read-out operation in the fourth embodiment of the present invention.

A fourth embodiment of the present invention will be described with reference to FIGS. 11 to 12. FIG. 11A is a plan view of a memory cell array using a non-volatile storage element in accordance with the present invention, and FIG. 11B is a cross-sectional view taken along the line X—X in FIG. 11A. FIG. 12A is a timing chart for explaining an information read-out method specific to this embodiment. The fourth embodiment differs in structure from the third embodiment in that a first side wall gate electrodes 35 in the form of strips and a second side wall gate electrodes 36 in the form of strips corresponding to those in the third embodiment are respectively formed as a first control gate electrode and a second control gate electrode without being connected to the-word lines 32.

As shown in FIGS. 11A and 11B, a first diffusion layer 42, a second diffusion layer 43 and a third diffusion layer 44, which are diffusion layers of an N-conduction type, for example, are formed in a major surface of a silicon substrate 1 of a P-conduction type. First control gate electrodes 45, second control gate electrodes 46 and gate electrodes 47 are formed on the silicon substrate 41 generally in correspondence with the place between the first diffusion layer 42 and the second diffusion layer 43 and the place between the second diffusion layer 43 and the third diffusion layer 44, with an insulating film interposed between each gate electrode and the silicon substrate 41. As shown in FIG. 11B, a multilayer insulating film formed of a first insulating film 48 (silicon oxide film), isolated pieces of material 49 and a second insulating film 50 is formed between each control gate electrode, i.e., the first (second) control gate electrode 45 or 46, and the silicon substrate 41. The insulating film between each gate electrode 47 and the silicon substrate 41 is a single-layer silicon oxide film, which is formed of the first insulating film 48. The first (second) control gate electrode 45 or 46 and the gate electrodes 47 are also separated electrically from each other by the above-described multilayer insulating film.

An on-diffusion layer insulating film 51 is formed, and the above-described first control gate electrodes 45 and second control gate electrode 46 are arranged in the same direction as the first diffusion layer 42, the second diffusion layer 43 and the third diffusion layer 44, as can be understood from FIG. 11A. The gate electrodes 47 (47a) are the same as those in the third embodiment and are isolated and connected to word lines 52 (52a).

Figure 12B:
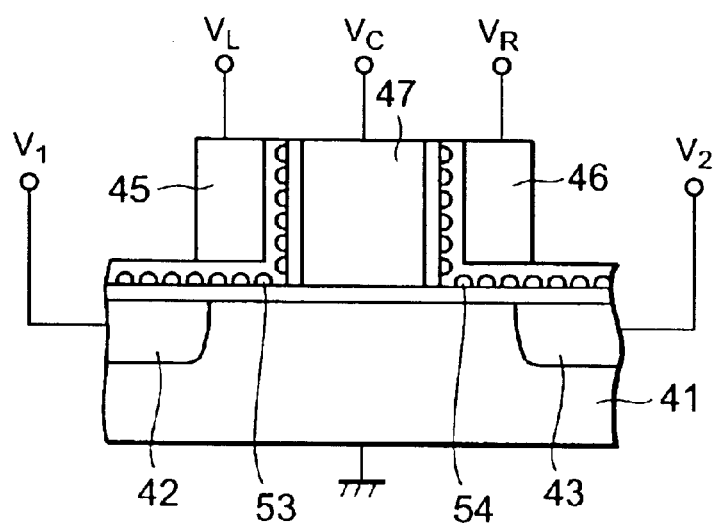
FIG. 12B is a schematic cross-sectional view of the nonvolatile storage element in the fourth embodiment.

Read-out of information in this embodiment will be described with reference to FIGS. 12A and 12B. FIG. 12A is a timing chart for explaining an information read-out method, and FIG. 12B is a schematic cross-sectional view of the nonvolatile storage element of the present invention for explaining the method. The components corresponding to those shown in FIGS. 11A and 11B are indicated by the same reference characters.

When information is read out from a first capture region 53 shown in FIG. 12B, the voltage $V_1$ of the first diffusion layer 42 is set to 0 V and the voltage $V_2$ of the second diffusion layer 43 is set to about 1.5 V as shown in FIG. 12A. Also, the voltage $V_L$ of the first control gate electrode 45 is set to an intermediate voltage between voltages $V_L$ for information "0" and information "1". The voltage corresponding to information "0" and the voltage corresponding to information "1" are a threshold voltage of the MIS transistor when information charge (electrons) is erased and another threshold voltage of the MIS transistor when information charge is written, as shown in FIG. 5. In the case shown in FIG. 5, $V_L$ is set to about 3 V, for example. The voltage $V_R$ of the second control gate electrode 46 is set to a voltage higher than the voltage corresponding to information "1". In the case shown in FIG. 5, $V_R$ is set to about 5 V, for example. Under this condition, the voltage $V_G$ of the gate electrode 47 (i.e., word line 52) is set to about 2 V.

In read-out of information from the first capture region 53, if such voltage settings are made, information "0" and information "1" from the first capture region 53 can be easily discriminated from each other without being influenced by information in a second capture region 54 (the amount of electrons stored as information charge).

When information is read out from the second capture region 54, the voltage $V_1$ of the first diffusion layer 42 and the voltage $V_2$ of the second diffusion layer 43 are replaced with each other. Then, the voltage $V_R$ of the second control gate voltage 46 is set to an intermediate voltage between the voltages for information "0" and information "1", as described above. Also, the voltage $V_L$ of the first control gate electrode 45 is set to a voltage higher than the voltage corresponding to the information "1". Under this condition, the voltage $V_G$ of the gate electrode 47 is set to about 2 V.

In read-out of information from the second capture region 54, if such voltage settings are made, information "0" and information "1" from the second capture region 54 can be easily discriminated from each other without being influenced by information in the first capture region 53 (the amount of electrons stored as information charge).

Also in this embodiment, as well as in the above-described third embodiment, a noticeable advantage of effectively improving the information charge holding characteristic can be obtained. In the fourth embodiment, two-bit regions may be provided in each of the first capture region 53 and the second capture region 54 for a four-bit/one-cell configuration.

Figure 13:
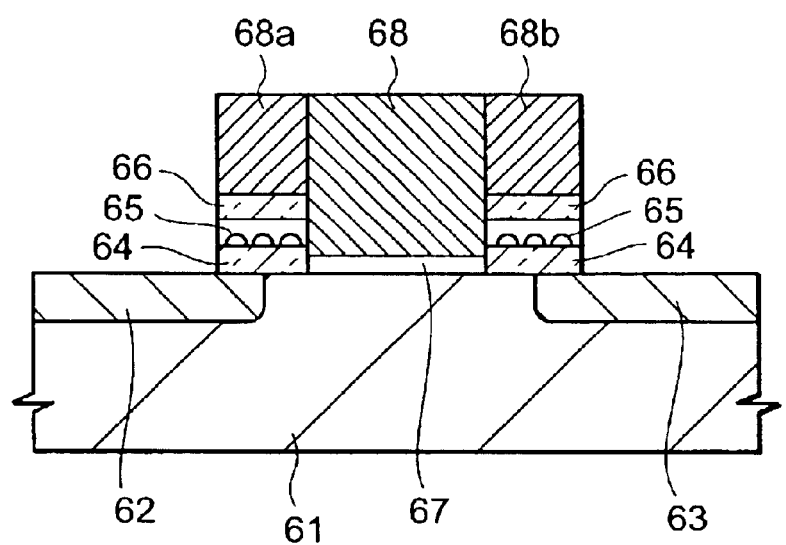
FIG. 13 is a cross-sectional view of a nonvolatile storage element which represents a fifth embodiment of the present invention.
Figure 14A:
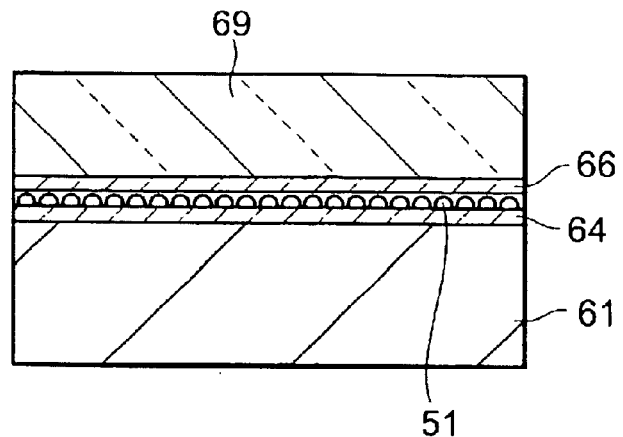
FIGS. 14A, 14B, and 14C are cross-sectional views of process steps for manufacturing the nonvolatile storage element in the fifth embodiment of the present invention.

A fifth embodiment of the present invention will be described with reference to FIGS. 13 to 16. FIG. 13 is a cross-sectional view of the basic structure of a nonvolatile storage element in accordance with the present invention, and FIGS. 14 to 16 are cross-sectional views of the storage element for explaining a method of manufacturing the storage element.

As shown in FIG. 13, a first diffusion layer 62 and a second diffusion layer 63 are formed in a major surface of a silicon substrate 61, and a first insulating film 64 is formed on the major surface of a silicon substrate 61 in the vicinity of each of the first diffusion layer 62 and the second diffusion layer 63. Isolated pieces of material 65 are formed on the first insulating film 64, and a second insulating film 66 is partially formed so as to cover the isolated pieces of material 65. A multilayer film is partially formed in this manner. A gate insulating film 67 different from the above-described multilayer film is formed on a greater part of the channel region of the MIS transistor. The isolated pieces of material 65 are the same as those described above in the description of the first (second) embodiment.

A gate electrode 68 is formed so s to cover the gate insulating film 67, and a first gate electrode end portion 68a and a second gate electrode end portion 68b are formed so as to cover the above-described multilayer insulating film. Each of the first gate electrode end portion 68a and the second gate electrode end portion 68b overlaps the first diffusion layer 62 or the third diffusion layer 63 with the multilayer insulating film interposed therebetween. The gate electrode 68 is formed of polycrystal silicon or polycrystal germanium containing an N-type impurity, while the first gate electrode end portion 68a and the second gate electrode end portion 68b are formed of a polycide, a polymetal or the like. These materials may be replaced with each other.

Also in the fifth embodiment, as well as in the first (second) embodiment, the information charge holding characteristic can be effectively improved. In this embodiment, the speed of the operation for reading out information is effectively increased. This is because the gate insulating film 67 can be formed of a material different from those of the multilayer insulating film, and because the capacitance value per unit area of the gate insulating film 67 can be set higher than that of the multilayer insulating film.

A method of manufacturing the above-described nonvolatile storage element will be described. As shown in FIG. 14A, a silicon oxide film having a film thickness of 4 nm is formed by thermal oxidation of the P-conduction type of silicon substrate 1, thereby providing the first insulating film 64. Isolated pieces of material 65 are formed on the surface of the first insulating film 64, as described above with respect to the first (second) embodiment. A silicon oxide film having a film thickness of 4 nm is deposited as the second insulating film 66 by CVD so as to completely cover the isolated pieces of material 65. An alumina film or a silicon nitride film having a film thickness of 200 nm is formed as a groove-forming insulating film 69 on the second insulating film 66.

Figure 14B:
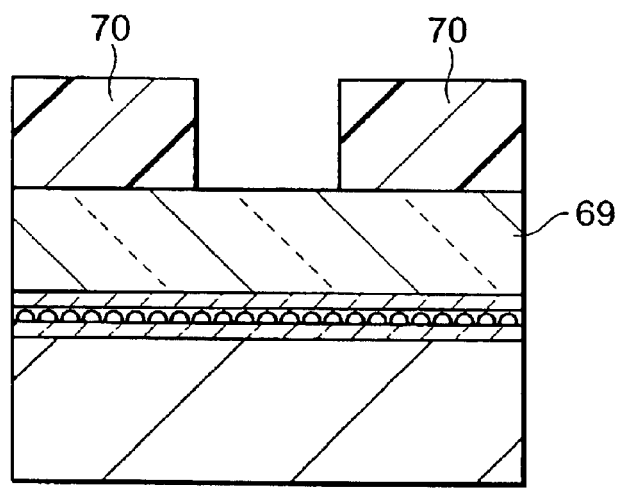
Figure 14C:
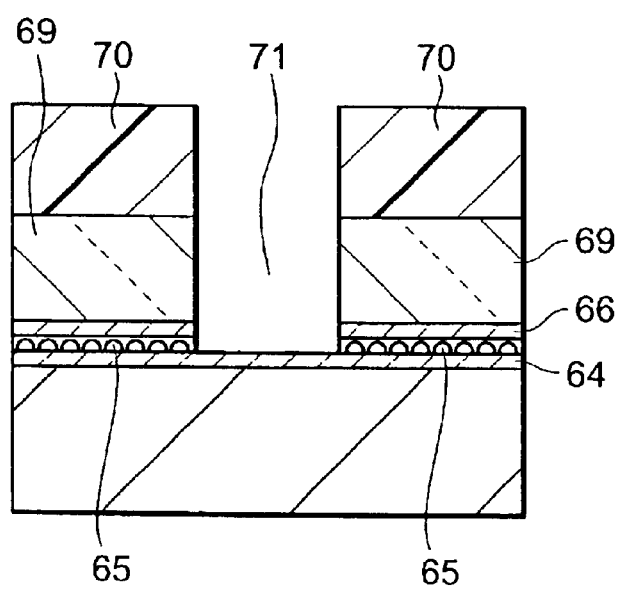

Subsequently, as shown in FIG. 14B, a resist mask 70 having a groove pattern is formed on the groove-forming insulating film 69 by a well-known lithography technique. The groove-forming insulating film 69, the second insulating film 66 and the isolated pieces of material 64 are successively etched by a dry etching technique using the resist mask 70 as an etching mask to form a groove 71. The first insulating film 64 is thereafter removed by wet etching.

Figure 15A:
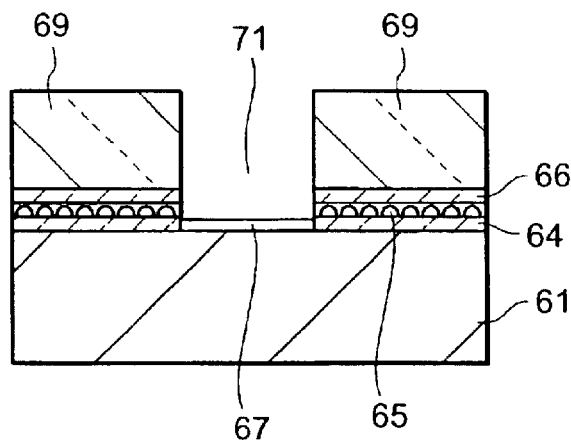
FIGS. 15A, 15B, and 15C are cross-sectional views of manufacturing process steps continued from FIG. 14.

Subsequently, thermal oxidation or oxynitridation using the groove-forming insulating film 69 as a mask is performed to form the gate insulating film 67 on the surface of the silicon substrate 61 in the groove 71, as shown in FIG. 15A. The effective thickness of the gate insulating film 67 is set smaller than the effective thickness of the multilayer film formed by the first insulating film 64, isolated pieces of-material 65 and second insulating film 66.

Figure 15B:
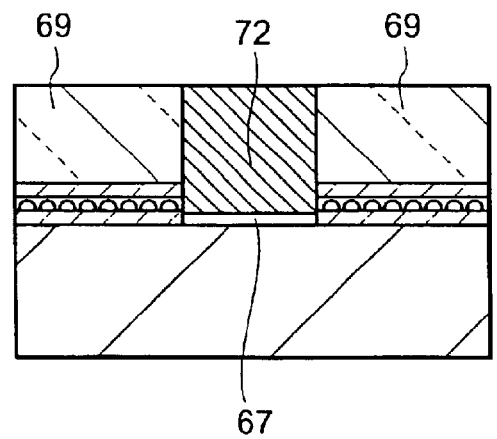

Subsequently, a polycrystal silicon film containing an N-type impurity is formed as a first electroconductive film so as to cover the gate insulating film 67 and to fill the groove 71. Unnecessary portions are removed by CMP using the groove-forming insulating film 69 as a polishing stopper. An embedded electroconductive film 72 such as shown in FIG. 15B is thereby formed.

Figure 15C:
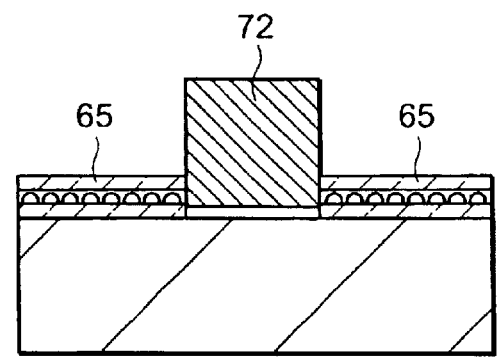

Subsequently, as shown in FIG. 15C, the groove-forming insulating film 69 is removed by wet etching. An embedded electroconductive film 72 projecting on the second insulating film 65 is thereby formed. The embedded electroconductive film 72 is processed into a predetermined pattern.

Figure 16A:
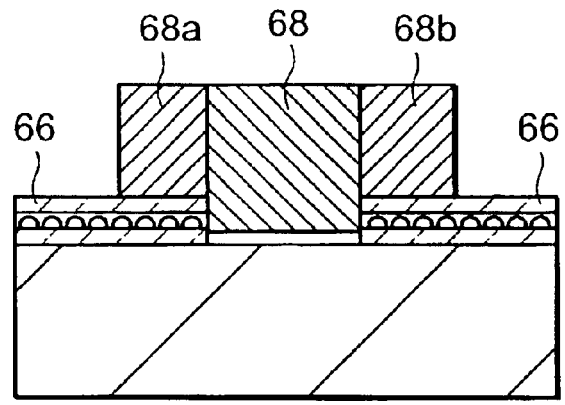
FIGS. 16A, 16B, and 16C are cross-sectional views of manufacturing process steps continued from FIG. 15.

Subsequently, a tungsten polycide film having a film thickness of about 200 nm is deposited as a second electroconductive film on the entire surface. Etching back of the tungsten polycide film is performed to form the first gate electrode end portion 68a and the second gate electrode end portion 68b as side wall electroconductive film on side wall portions of the gate electrode 68, as shown in FIG. 16A.

Figure 16B:
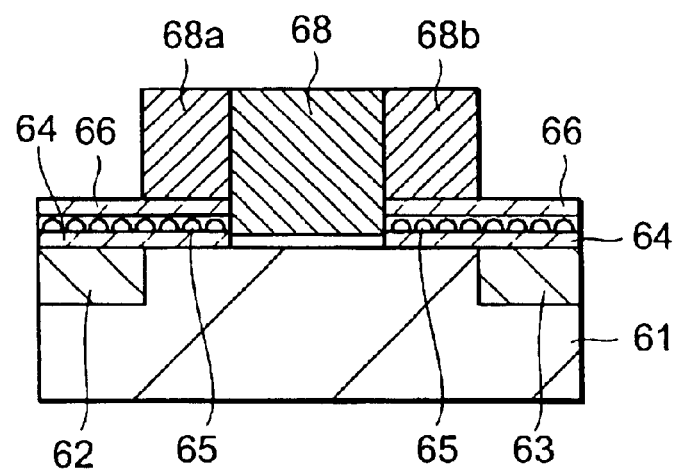
Figure 16C:
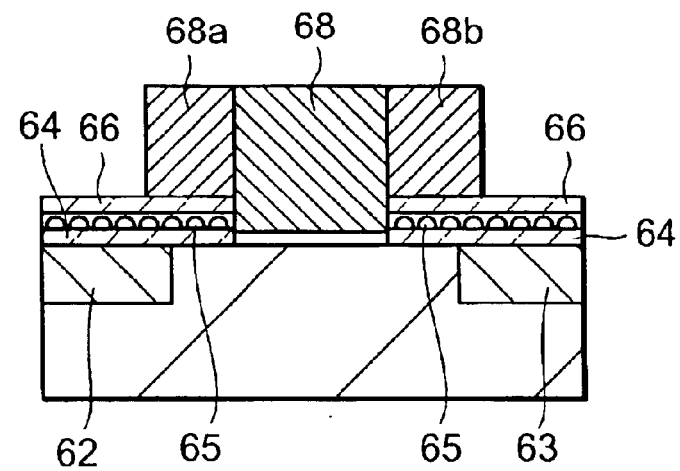

Subsequently, as shown in FIG. 16B, ion implantation of an arsenic through the first insulating film 64, the isolated pieces of material 65 and the second insulating film 66 is performed by using the above-described gate electrode 68, first gate electrode end portion 68a and second gate electrode end portion 68b as a mask, followed by a heat treatment. The first diffusion layer 62 and the second diffusion layer 63 are thereby formed in the surface of the silicon substrate 61. As shown in FIG. 6C, each of the first gate electrode end portion 68a and the second gate electrode end portion 68b is made to overlap the first diffusion layer 62 or the second diffusion layer 63, the multilayer film formed by the first insulating film 64, the isolated pieces of material 65 and the second insulating film 66 being interposed therebetween. Thereafter, the nonvolatile storage element having the structure described above with reference to FIG. 13 is completed. In the above-described method, a polycrystal silicon film containing an N-type impurity may be deposited in place of the tungsten polycide film.

Figure 17:
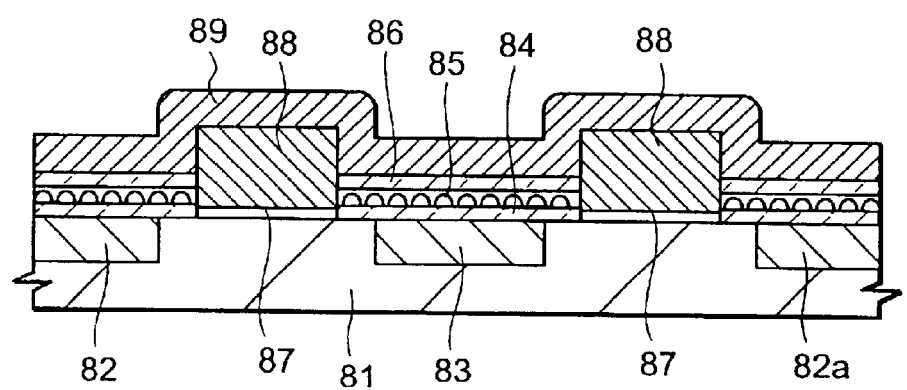
FIG. 17 is a cross-sectional view of a nonvolatile memory cell array which represents a sixth embodiment of the present invention.

A sixth embodiment of the present invention will be described with reference to FIGS. 17 to 20. FIG. 17 is a cross-sectional view of a memory cell array using a nonvolatile storage element in accordance with the present invention. FIGS. 18 to 20 are cross-sectional views and plan views of the memory cell array for explaining an example of process steps for manufacturing the memory cell array.

As shown in FIG. 17, $N^+$ diffusion layers are formed as first diffusion layers 82 and 82a and a second diffusion layer 83 in a major surface of a silicon substrate 81 of a P-conduction type in order to form two memory cells. These diffusion layers form bit lines for the memory cells. A first insulating film 84, isolated pieces of material 85 and a second insulating film 86 constituting a multilayer film are formed on the major surface of the silicon substrate 81 not over the entire channel region of the transistor but on each of regions adjacent to the source and drain of the transistor in the vicinity of the first diffusion layer 82 and 82a or the second diffusion layer 83. A gate insulating film 87 different from the multilayer film is formed on a greater part of the channel region. The gate insulating film 87 is formed by a silicon oxide film.

Gate electrodes 88 are formed so as to cover only the gate insulating film 87. The gate electrodes 88 are formed of polycrystal silicon containing an N-type impurity. Word lines 89 are electrically connected to the gate electrodes 88 and are arranged perpendicularly to the above-described diffusion layers forming bit lines. The word lines 89 cover the multilayer insulating film and overlap the diffusion layers with the multilayer insulating film interposed therebetween. The word lines 89 are formed by a film of a metal having a high melting point or a polycide film of the metal.

Figure 18A:
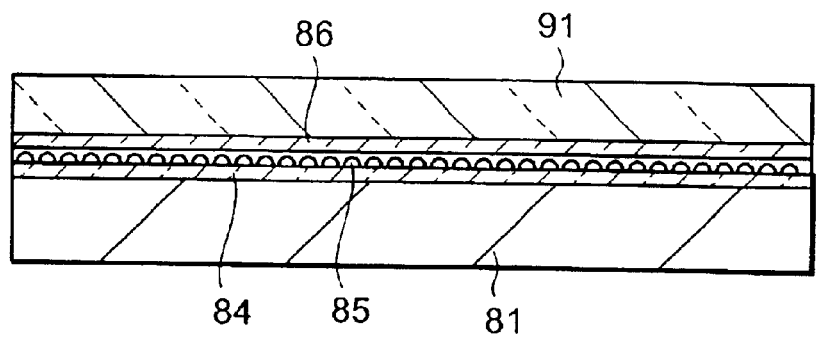
FIGS. 18A to 18D are cross-sectional views of process steps for manufacturing the nonvolatile memory cell array in the sixth embodiment of the present invention.

A method of manufacturing the above-described memory cell array will be described. As shown in FIG. 18A, the first insulating film 84 is formed by thermal oxidation of the silicon substrate 81, and isolated pieces of material 86 are formed on the surface of the first insulating film 84, as are those described in the description of the first (second) embodiment. A silicon oxide layer is formed as the second insulating film 86 by CVD so as to cover the isolated pieces of material 85. Thereafter, an alumina film or a silicon nitride film having a film thickness of 50 nm is formed as a groove-forming insulating film 90 on the second insulating film 86.

Figure 18B:
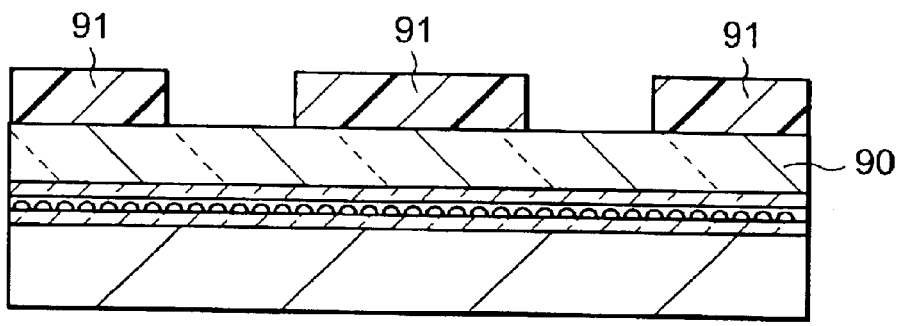
Figure 18C:
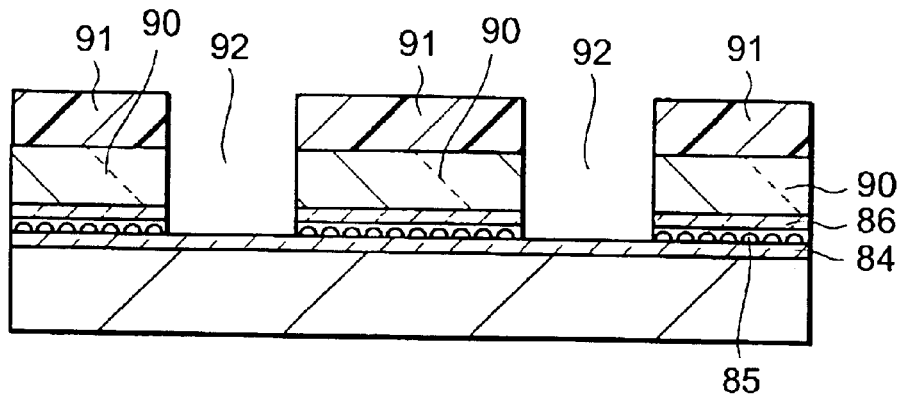

Subsequently, as shown in FIG. 18B, a resist mask 91 having a groove pattern is formed on the groove-forming insulating film 90 by a well-known lithography technique. The groove-forming insulating film 90, the second insulating film 86 and the isolated pieces of material 85 are successively etched to form grooves 92. The first insulating film 84 is thereafter removed by wet etching.

Figure 18D:
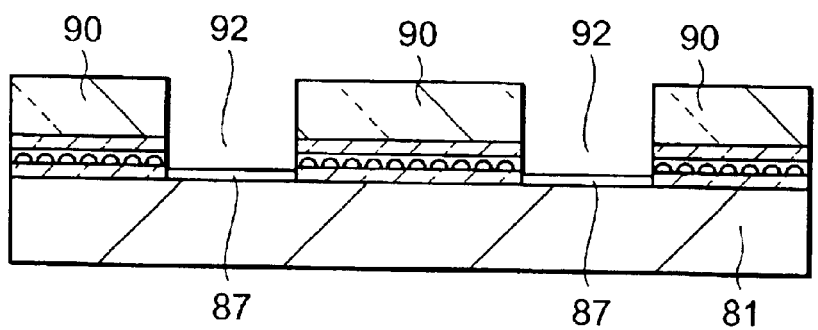

Subsequently, thermal oxidation using the groove-forming insulating film 90 as a mask is performed to form the gate insulating film 87 on the surface of the silicon substrate 91 in the grooves 92, as shown in FIG. 18D. The effective thickness of the gate insulating film 87 is set smaller than the effective thickness of the multilayer film formed by the first insulating film 84, isolated pieces of material 85 and second insulating film 86.

Figure 19A:
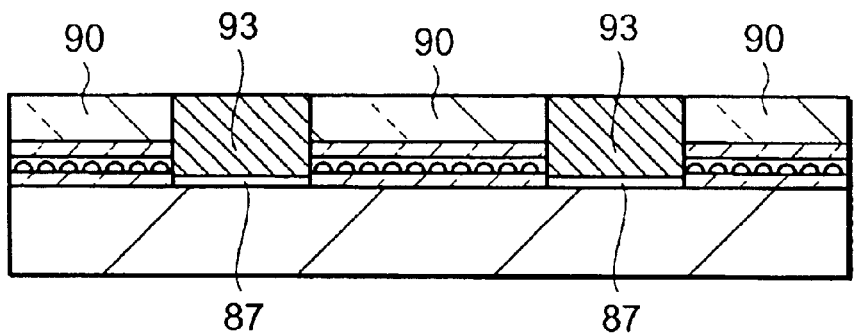
FIGS. 19A to 19D are cross-sectional views of manufacturing process steps continued from FIG. 18.

Subsequently, a polycrystal silicon film containing an N-type impurity is formed as a first electroconductive film so as to cover the gate insulating film 87 and to fill the grooves 92. Unnecessary portions are removed by CMP using the groove-forming insulating film 90 as a polishing stopper. An embedded electroconductive film 93 is thereby formed in a planar strip pattern, as shown in FIG. 19A. The thickness of the embedded electroconductive film 93 is about 50 nm.

Figure 19B:
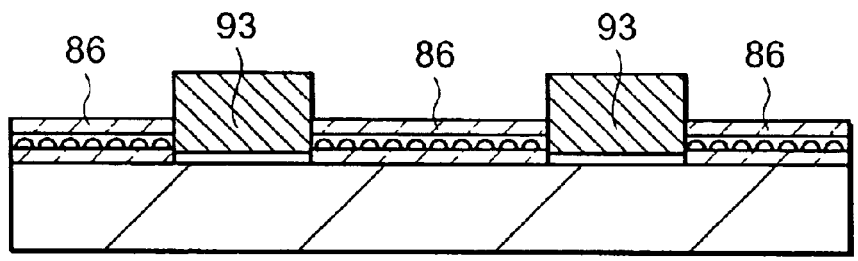

Subsequently, as shown in FIG. 19B, the groove-forming insulating film 90 is removed by wet etching. An embedded electroconductive film 93 projecting on the second insulating film 86 is thereby formed.

Figure 19C:
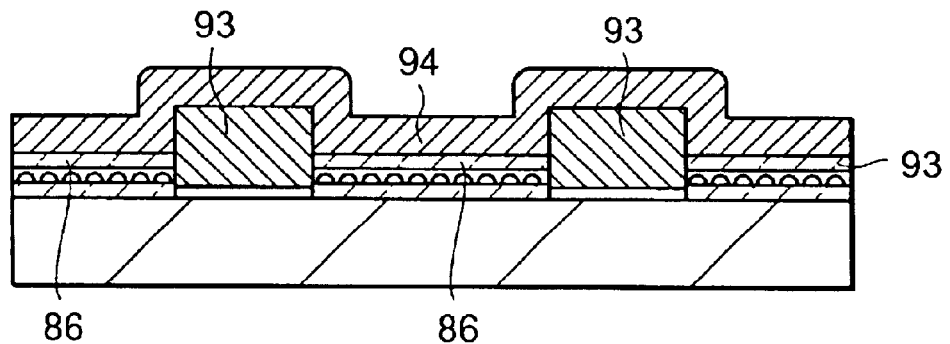

Subsequently, as shown in FIG. 19C, an electroconductive film 94 such as a tungsten film having a film thickness of about 200 nm is deposited as a second electroconductive film on the entire surface to form a layer along the embedded electroconductive film 93 and the second insulating film 86.

Figure 19D:
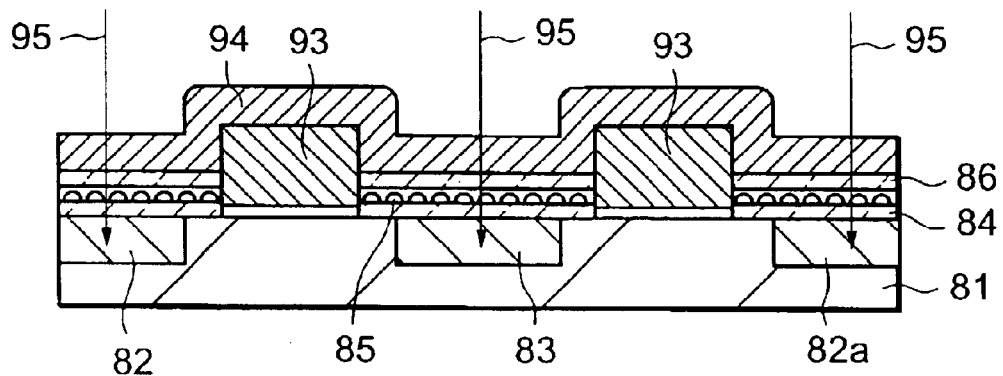

Subsequently, as shown in FIG. 19D, arsenic ion 95 implantation is performed by using the embedded electroconductive film 93 as a mask. The energy for this ion implantation is suitably selected to enable the first diffusion layers 82 and 82a and the second diffusion layer 83 to be formed in the surface of the silicon substrate 81 by ion implantation through the first insulating film 84, the isolated pieces of material 85 and the second insulating film 86. By this ion implantation, no arsenic ions are introduced into the surface of the silicon substrate 81 below the above-described embedded electroconductive film 93 and side wall portions of the electroconductive film 94.

The above-described electroconductive film 94 and embedded electroconductive film 93 are processed by lithography and dry etching techniques to form the gate electrodes 88 as well as the word lines 89 described above with reference to FIG. 17, thereby completing the memory cell array having the structure described above with reference to FIG. 17 is completed.

A method of manufacturing nonvolatile storage elements used in the above-described memory cell array will be described with reference to plan views of the memory cell array.

Figure 20A:
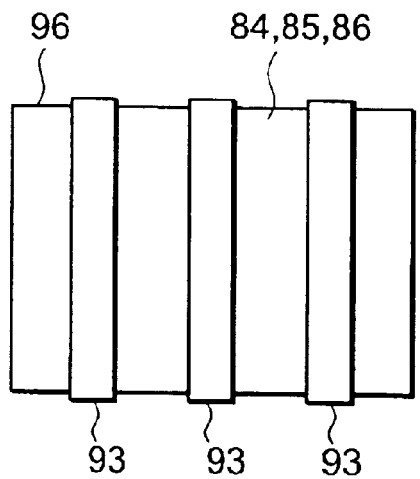
FIGS. 20A to 20D are plan views of process steps for manufacturing the nonvolatile memory cell array.

As shown in FIG. 20A, a P-conduction type of well layer 96 is formed and the first insulating film 84, the isolated pieces of material 85, the second insulating film 86 and the embedded electroconductive film 93 are thereafter formed in the step described above with reference to FIG. 18B.

Figure 20B:
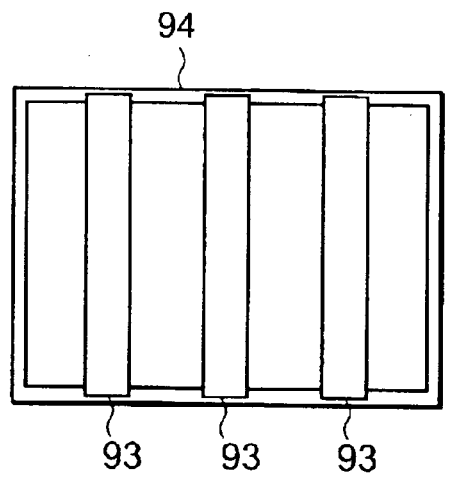

Subsequently, in the step shown in FIG. 20B, the electroconductive film 94 is formed on the entire surface so as to cover the embedded electroconductive film 93 and other portions. This step corresponds to the step shown in FIG. 18C.

Figure 20C:
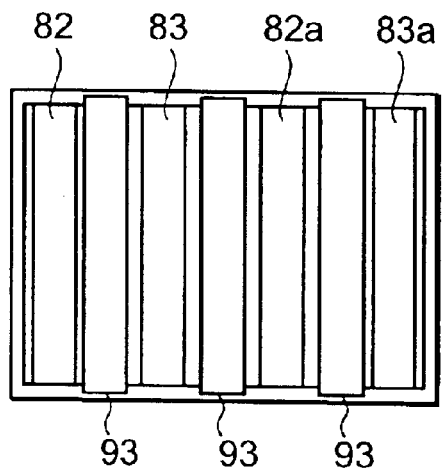

Subsequently, as shown in FIG. 20C, arsenic ion implantation and a heat treatment are performed on the entire surface to for the first diffusion layers 82 and 82a and the second diffusion layer 83 and 83a so that these layers extend parallel to the embedded electroconductive film 93. This step corresponds to the step shown in FIG. 18D.

Figure 20D:
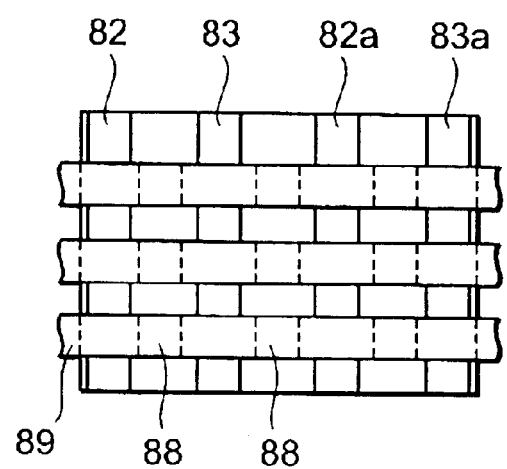
Figure 21:
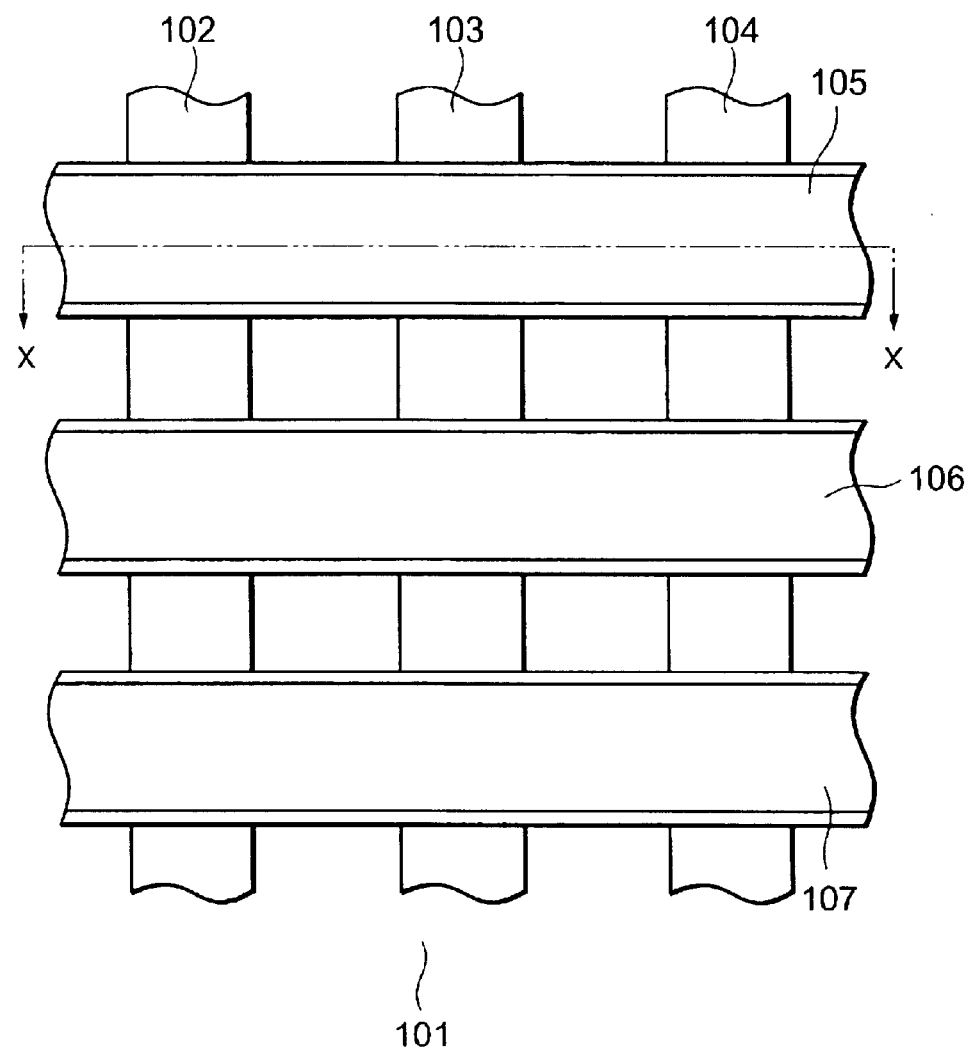
FIG. 21 is a plan view of NROM cells for explaining the first conventional art.
Figure 22A:
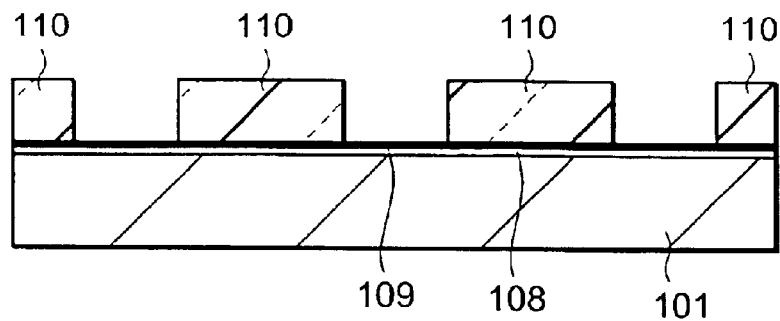
FIGS. 22A to 22D are cross-sectional views of process steps for manufacturing the NROM cells for explaining a first conventional art.
Figure 22B:
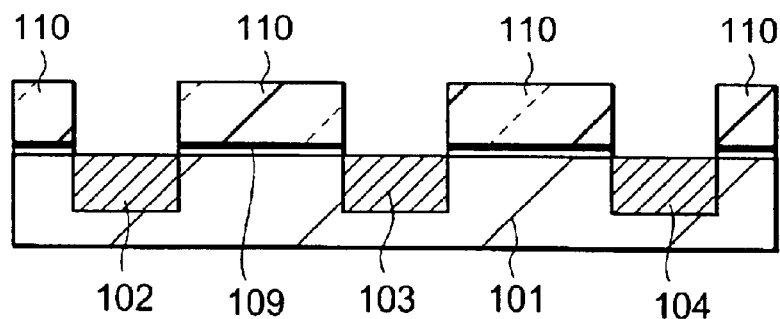
Figure 22C:
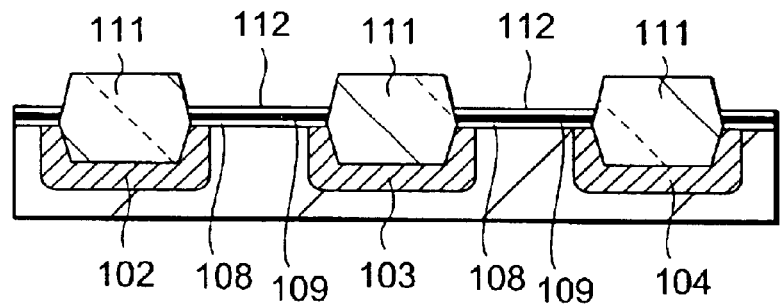
Figure 22D:
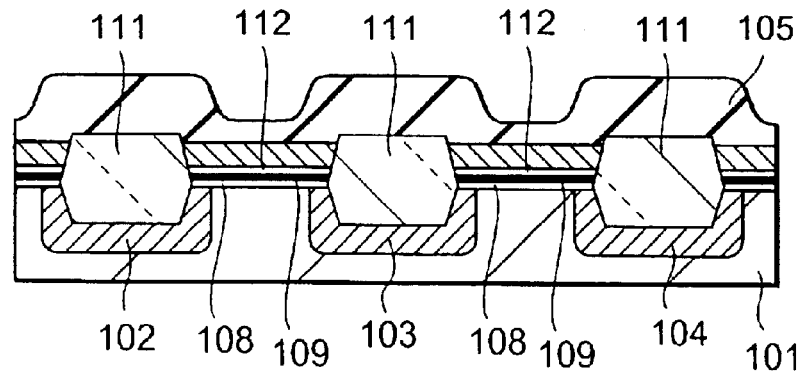

Subsequently, as shown in FIG. 20D, the electroconductive film 94 and the embedded electroconductive film 93 are processed to simultaneously form the word lines 89 and the gate electrodes 88. The bit lines formed by the first diffusion layers 82 and 82a and the second diffusion layers 83 and 83a and the word lines 89 are arranged perpendicularly to each other.

In this embodiment, the same advantage as that described above with respect to the first (second) embodiment is obtained. Further, the speed of the operation for reading out information from the memory cell is effectively increased.

In each of the above-described second to sixth embodiments, the silicon layer is formed on the multilayer film formed by the first insulating film, the isolated pieces of material and the second insulating film to have the function of protecting the multilayer insulating film from damage or the like in the manufacturing process. Thus, the present invention enables a nonvolatile storage element having improved reliability to be easily formed.

In each of the above-described embodiment, a silicon germanium film may be used as a gate electrode material instead of polycrystal silicon film.

The embodiments of the present invention have been described with respect to the case where the first insulating film and the second insulating film are formed of a silicon oxide film, and where the isolated pieces of material are formed of silicon nitride, silicon or silicon germanium. However, the present invention is not limited to this arrangement. The isolated pieces of material may be formed of a metal oxide such as tantalum oxide or hafnium oxide. Further, a modified layer formed by thermal nitridation of the surface of a silicon oxide film may be used as the first insulating film. Further, as the above-described information charge capture regions, discontinuous isolated pieces of material, i.e., isolated pieces of a high-melting-point metal formed so as to have a semispherical shape, a dot pattern, a land-like shape, or a columnar shape, may be used.

The present invention is not limited to the above-described embodiments, and the embodiments may be changed according to needs within the scope of the technical spirit of the invention.

If the nonvolatile semiconductor device of the present invention is applied to the memory cell of a nonvolatile memory such as a flash memory, the information holding characteristic of the memory is effectively improved, and the development of such memories capable of higher-speed lower-voltage operation at the time of reading out accumulated information, in particular, can be promoted. Also, the speed of the operation of a flash memory at the time of writing information charge can also be increased. The present invention also promotes the development of multibit/one-cell storage elements. Thus, the present invention makes it easier to develop nonvolatile memories having a larger capacity and improved functions or an increased number of functions.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A nonvolatile semiconductor storage device comprising:

a semiconductor substrate;

a gate electrode formed on a surface of said semiconductor substrate;

a first control electrode and a second control gate electrode formed on the surface of said semiconductor substrate; and a first diffusion layer and a second diffusion layer formed in the surface of said semiconductor substrate on opposite sides of a set of said first control gate electrode, said gate electrode and said second control gate electrode disposed in this order, a channel region being formed between said first and second diffusion layers, wherein a first insulating layer, isolated pieces of material and a second insulating layer are formed in order in a multilayer structure between said first control gate electrode and the surface of said semiconductor substrate and between said second control gate electrode and the surface of said semiconductor substrate, a third insulating layer being formed between said gate electrode and the surface of said semiconductor substrate, and wherein said first control gate electrode, said gate electrode and said second control gate electrode are electrically connected to each other.

2. A nonvolatile semiconductor storage device comprising:

a semiconductor substrate;

a gate electrode formed on a surface of said semiconductor substrate; and a first diffusion layer and a second diffusion layer formed in the surface of said semiconductor substrate on opposite sides of said gate electrode, a channel region being formed between said first and second diffusion layers, wherein a first insulating layer, isolated pieces of material and a second insulating layer are formed in order on a region which is part of said channel region, and which is adjacent to said first diffusion layer or said second diffusion layer; a third insulating layer is formed on a region which is part of said channel region, and on which none of said first insulating layer, said isolated pieces of material and said second insulating layer is formed; and said first insulating layer, said isolated pieces of material, said second insulating layer and said third insulating layer are covered with said gate electrode.

3. A nonvolatile semiconductor storage device comprising:

a semiconductor substrate;

a gate electrode formed on a surface of said semiconductor substrate;

a first control electrode and a second control gate electrode formed on the surface of said semiconductor substrate; and a first diffusion layer and a second diffusion layer formed in the surface of said semiconductor substrate on opposite sides of a set of said first control gate electrode, said gate electrode and said second control gate electrode disposed in this order, a channel region being formed between said first and second diffusion layers, wherein a first insulating layer, isolated pieces of material and a second insulating layer are formed in order in a multilayer structure between said first control gate electrode and the surface of said semiconductor substrate and between said second control gate electrode and the surface of said semiconductor substrate, a third insulating layer being formed between said gate electrode and the surface of said semiconductor substrate, and wherein said third insulating layer has a capacitance value per unit area larger than the capacitance value per unit area of the multilayer structure in which said first insulating layer, said isolated pieces of material and said second insulating layer are formed.

4. A nonvolatile semiconductor storage device comprising:

a semiconductor substrate;

a first diffusion layer and a second diffusion layer selectively formed in said semiconductor substrate apart from each other to define a channel region therebetween;

a first insulating layer partially embedded in said first diffusion layer so that a bottom surface of said first insulating layer is at a lower level than a surface of said channel region;

a second insulating layer partially embedded in said second diffusion layer so that a bottom surface of said second insulating layer is at a lower level than a surface of said channel region;

a third insulating layer formed to cover the surface of said channel region;

a plurality of insulating pieces formed on said third insulating layer dispersively from one another; and a fourth insulating layer formed to cover said third insulating layer and said plurality of insulating pieces.

5. A nonvolatile semiconductor storage device comprising:

a semiconductor substrate;

a first diffusion layer, a second diffusion layer and a third diffusion layer formed apart from one another to define a first channel region being formed between said first and second diffusion layers and a second channel region being formed between said second and third diffusion layers;

a first insulating layer formed to cover the surface of said channel regions;

a plurality of insulating pieces formed on said first insulating layer dispersively from one another;

a second insulating layer formed to cover said first insulating layer and said plurality of insulating pieces; and a first gate electrode and a second gate electrode formed above said first channel region and said second channel region.

6. The nonvolatile semiconductor storage device according to claim 4, wherein each of said first insulating layer and said second insulating layer is formed of a silicon oxide film, and said isolated pieces of material is formed of silicon nitride, silicon (Si), silicon germanium (SiGe) or a metal having a high melting point.

7. The nonvolatile semiconductor storage device according to claim 6, wherein said isolated pieces of material has a semispherical, land-like or columnar structure.

8. The nonvolatile semiconductor storage device according to claim 7, wherein said isolated pieces of material has a semispherical structure and has a diameter of 1 to 50 nm, and the distance between said isolated pieces of material is 2 to 50 nm.

9. The nonvolatile semiconductor storage device according to claim 1, wherein an end portion of said gate electrode, said first control gate electrode or said second control gate electrode overlaps said first diffusion layer or said second diffusion layer with said insulating films in the multilayer structure interposed therebetween.

10. The nonvolatile semiconductor storage device according to claim 4, wherein information charge write and erase regions are formed in at least two places including a plurality of said isolated pieces of material close to said first diffusion layer or said second diffusion layer and existing on said channel region.

11. The device as claimed in claim 5, further comprising:
- a third insulating layer partially embedded in said first diffusion layer so that a bottom surface of said third insulating layer is at a lower level than a surface of said channel region;
- a fourth insulating layer partially embedded in said second diffusion layer so that a bottom surface of said fourth insulating layer is at a lower level than a surface of said channel region; and
- a fifth insulating layer partially embedded in said third diffusion layer so that a bottom surface of said fifth insulating layer is at a lower level than a surface of said channel region.

12. The device as claimed in claim 5, wherein said first insulating layer, said plurality of insulating pieces and said second insulating layer are formed in succession on said first and second channel regions and on said first, second and third diffusion layers.

13. The device as claimed in claim 12, wherein said first, second and third insulating layers formed above said first, second and third diffusion layers via said first insulating layer, said plurality of insulating pieces and said second insulating layer.

14. The device as claimed in claim 5, further comprising a conductive line electrically coupled to said first gate electrode and said second gate electrode.

* * * * *